(12) United States Patent
Murakami

(10) Patent No.: US 12,080,666 B2
(45) Date of Patent: Sep. 3, 2024

(54) SEMICONDUCTOR STORAGE DEVICE WITH BONDING ELECTRODES

(71) Applicant: KIOXIA CORPORATION, Tokyo (JP)

(72) Inventor: Hideaki Murakami, Saitama (JP)

(73) Assignee: Kioxia Corporation, Tokyo (JP)

( * ) Notice: Subject to any disclaimer, the term of this patent is extended or adjusted under 35 U.S.C. 154(b) by 302 days.

(21) Appl. No.: 17/665,070

(22) Filed: Feb. 4, 2022

(65) Prior Publication Data

US 2023/0083442 A1 Mar. 16, 2023

(30) Foreign Application Priority Data

Sep. 16, 2021 (JP) ................................. 2021-151418

(51) Int. Cl.
*H01L 23/00* (2006.01)
*H01L 25/065* (2023.01)

(52) U.S. Cl.
CPC .............. *H01L 24/08* (2013.01); *H01L 24/06* (2013.01); *H01L 25/0657* (2013.01); *H01L 2224/04042* (2013.01); *H01L 2224/08146* (2013.01); *H01L 2224/09515* (2013.01); *H01L 2225/06506* (2013.01); *H01L 2225/06562* (2013.01)

(58) Field of Classification Search
CPC ...... H01L 24/08; H01L 24/06; H01L 25/0657
See application file for complete search history.

(56) References Cited

U.S. PATENT DOCUMENTS

| | | | |
|---|---|---|---|
| 6,184,121 B1 | 2/2001 | Buchwalter et al. | |
| 8,455,936 B2 | 6/2013 | O'Neill | |
| 11,127,632 B1* | 9/2021 | Shih | ................. H01L 21/76829 |
| 2020/0203329 A1 | 6/2020 | Kanamori et al. | |
| 2020/0286842 A1 | 9/2020 | Sanuki | |
| 2020/0402959 A1 | 12/2020 | Eom et al. | |
| 2021/0082877 A1 | 3/2021 | Uchiyama | |
| 2021/0082897 A1 | 3/2021 | Okada et al. | |
| 2021/0082900 A1 | 3/2021 | Tanioka | |
| 2021/0111122 A1* | 4/2021 | Liu | ........................ H10B 43/27 |
| 2021/0118849 A1 | 4/2021 | Limaye et al. | |
| 2021/0167017 A1 | 6/2021 | Eom et al. | |
| 2021/0202458 A1* | 7/2021 | Jung | ...................... H10B 43/27 |

(Continued)

FOREIGN PATENT DOCUMENTS

JP 2018-026518 A 2/2018
TW 202129876 A 8/2021

*Primary Examiner* — Nathan W Ha
(74) *Attorney, Agent, or Firm* — Kim & Stewart LLP

(57) ABSTRACT

A semiconductor storage device includes first and second chips. The first chip has first bonding electrodes on a first surface. The second chip has second bonding electrodes on a second surface. The first surface is bonded to the second surface and the first bonding electrodes are electrically connected to the second bonding electrodes. One of the first and second chips has a first bonding pad electrode connectable to a bonding wire for data input/output. A first one of the first bonding electrodes is electrically connected to the first bonding pad electrode. The first chip has, on the first surface, a first insulating layer surrounding the first one of the first bonding electrodes and a second insulating layer that is farther from the first one of the first bonding electrodes than the first insulating layer and formed of a material different from that of the first insulating layer.

20 Claims, 22 Drawing Sheets

(56) References Cited

U.S. PATENT DOCUMENTS

| | | | |
|---|---|---|---|
| 2021/0210460 A1* | 7/2021 | He | H01L 24/94 |
| 2021/0217716 A1* | 7/2021 | Wu | H10B 41/40 |
| 2021/0225790 A1* | 7/2021 | Chen | H01L 24/32 |
| 2021/0233893 A1* | 7/2021 | Greco | H01L 25/0657 |
| 2021/0265313 A1* | 8/2021 | Chen | H01L 23/528 |
| 2021/0280560 A1* | 9/2021 | Huang | H01L 23/552 |
| 2021/0295899 A1* | 9/2021 | Watanabe | G11C 5/06 |
| 2021/0327838 A1* | 10/2021 | Hou | H01L 24/03 |
| 2021/0343669 A1* | 11/2021 | Jung | H01L 25/18 |
| 2021/0358875 A1* | 11/2021 | Lee | H01L 24/96 |
| 2021/0375848 A1* | 12/2021 | Zhou | H01L 24/09 |
| 2021/0384137 A1* | 12/2021 | Choi | H01L 23/293 |
| 2021/0407941 A1* | 12/2021 | Haba | H01L 24/80 |
| 2021/0407968 A1* | 12/2021 | Kim | H01L 29/42344 |
| 2022/0013502 A1* | 1/2022 | Lee | H01L 24/06 |
| 2022/0013503 A1* | 1/2022 | Jung | H01L 24/09 |
| 2022/0037268 A1* | 2/2022 | Shen | H01L 21/78 |
| 2022/0045005 A1* | 2/2022 | Cui | H01L 21/76805 |
| 2022/0045093 A1* | 2/2022 | Lee | H01L 24/06 |
| 2022/0052099 A1* | 2/2022 | Ito | H01L 27/14623 |
| 2022/0059455 A1* | 2/2022 | Chen | H01L 21/76802 |
| 2022/0077129 A1* | 3/2022 | Sung | H01L 25/0657 |
| 2022/0085048 A1* | 3/2022 | Lee | H01L 21/823462 |
| 2022/0139851 A1* | 5/2022 | Chang | H01L 25/0657 257/734 |
| 2022/0139939 A1* | 5/2022 | Lee | H10B 43/40 257/314 |
| 2022/0139944 A1* | 5/2022 | Hwang | H01L 24/08 257/314 |
| 2022/0223554 A1* | 7/2022 | Hofrichter | H01L 21/32115 |
| 2022/0231012 A1* | 7/2022 | Cheng | H01L 25/50 |
| 2022/0246562 A1* | 8/2022 | Hou | H01L 24/05 |
| 2022/0246632 A1* | 8/2022 | Shimane | H01L 25/0657 |
| 2022/0262768 A1* | 8/2022 | Chen | H01L 23/3135 |
| 2022/0278062 A1* | 9/2022 | Matsunaga | H01L 21/78 |
| 2022/0278095 A1* | 9/2022 | Kao | H01L 25/16 |
| 2022/0285233 A1* | 9/2022 | Li | H01L 22/14 |
| 2022/0310545 A1* | 9/2022 | Shih | H01L 24/19 |
| 2022/0399294 A1* | 12/2022 | Dogiamis | H01L 24/80 |
| 2023/0008286 A1* | 1/2023 | Hou | H01L 24/03 |
| 2023/0317709 A1* | 10/2023 | Okada | H10B 41/27 257/299 |

* cited by examiner

SEMICONDUCTOR STORAGE DEVICE WITH BONDING ELECTRODES

CROSS-REFERENCE TO RELATED APPLICATION

This application is based upon and claims the benefit of priority from Japanese Patent Application No. 2021-151418, filed Sep. 16, 2021, the entire contents of which are incorporated herein by reference.

FIELD

Embodiments described herein relate generally to a semiconductor storage device.

BACKGROUND

A semiconductor storage device including a first chip and a second chip bonded to the first chip is known. The first chip includes a semiconductor substrate, a plurality of transistors, and a plurality of first bonding electrodes. The second chip includes a memory cell array and a plurality of second bonding electrodes bonded to the plurality of first bonding electrodes.

DETAILED DESCRIPTION

Figure 1:
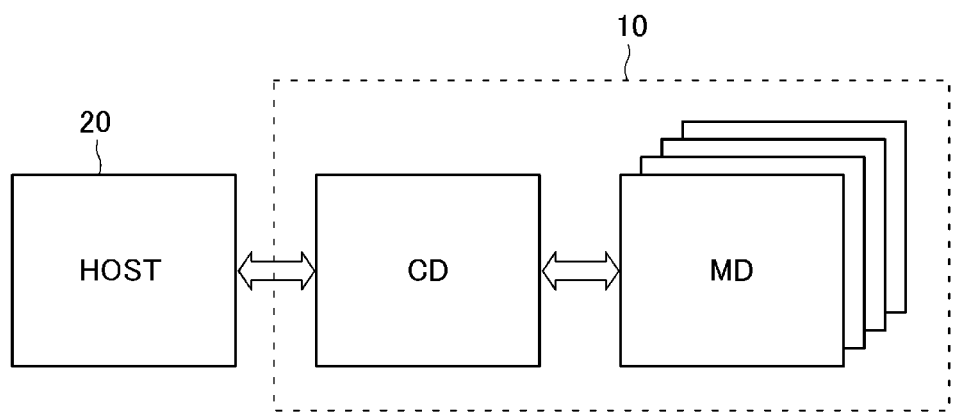
FIG. 1 is a schematic block diagram illustrating a configuration of a memory system according to a first embodiment.

Embodiments provide a semiconductor storage device that operates at high speed.

In general, according to an embodiment, a semiconductor storage device includes a first chip including a semiconductor substrate and a plurality of transistors and a second chip including a memory cell array. The first chip has a plurality of first bonding electrodes on a first surface. The second chip has a plurality of second bonding electrodes on a second surface. The first surface is bonded to the second surface and the first bonding electrodes are electrically connected to the second bonding electrodes. One of the first and second chips has a first bonding pad electrode connectable to a bonding wire for data input/output. A first one of the first bonding electrodes is electrically connected to the first bonding pad electrode. The first chip has, on the first surface, a first insulating layer surrounding the first one of the first bonding electrodes and a second insulating layer that is farther from the first one of the first bonding electrodes than the first insulating layer and formed of a material different from that of the first insulating layer.

A semiconductor storage device according to embodiments will be described in detail with reference to the drawings. The following embodiments are merely examples, and are not intended to limit the present disclosure. The following drawings are schematic, and some configurations and the like may be omitted for the sake of convenience in description. Common portions in a plurality of embodiments are denoted by the same reference signs, and repetitive description thereof may be omitted.

The term "semiconductor storage device" used in the present specification may mean a memory die, or mean a memory system including a controller die such as a memory chip, a memory card, or a solid state drive (SSD). The term "semiconductor storage device" may mean a configuration including a host computer such as a smartphone, a tablet terminal, and a personal computer.

In the present specification, when a first component is said to be "electrically connected" to a second component, the first component may be directly connected to the second component, or the first component may be connected to the second component via a wiring, a semiconductor member, a transistor, or the like. For example, when three transistors are connected in series, the first transistor is "electrically connected" to the third transistor even though the second transistor is in an OFF state.

In the present specification, a case where the first component is said to be "connected between" the second component and the third component may mean that the first component, the second component, and the third component are connected in series and the second component is connected to the third component via the first component.

In the present specification, a case where a circuit or the like is said to "cause two wirings and the like to be electrically connected" may mean, for example, that the circuit or the like includes a transistor and the like, the transistor and the like are provided on a current path between the two wirings and the like, and the transistor and the like turn into an ON state.

In the present specification, a predetermined direction parallel to an upper surface of a substrate is referred to as an X direction, a direction which is parallel to the upper surface of the substrate and is perpendicular to the X direction is referred to as a Y direction, and a direction perpendicular to the upper surface of the substrate is referred to as a Z direction or a thickness direction.

In the present specification, a direction along a predetermined surface is referred to as a first direction, a direction intersecting the first direction along the predetermined surface is referred to as a second direction, and a direction intersecting the predetermined surface is referred to as a third direction. The first direction, the second direction, and the third direction may or may not correspond to any of the X direction, the Y direction, and the Z direction.

First Embodiment

Memory System 10

FIG. 1 is a schematic block diagram illustrating a configuration of a memory system 10 according to a first embodiment.

The memory system 10 performs a read operation, a write operation, an erasing operation, and the like in accordance with a signal transmitted from a host computer 20. The memory system 10 is, for example, a memory chip, a memory card, an SSD, or other systems capable of storing user data. The memory system 10 includes a plurality of memory dies MD that store user data, and a controller die CD connected to the plurality of memory dies MD and the host computer 20. The controller die CD includes, for example, a processor and a RAM, and performs processing such as conversion between a logical address and a physical address, bit error detection/correction, garbage collection (compaction), and wear leveling.

Figure 2:
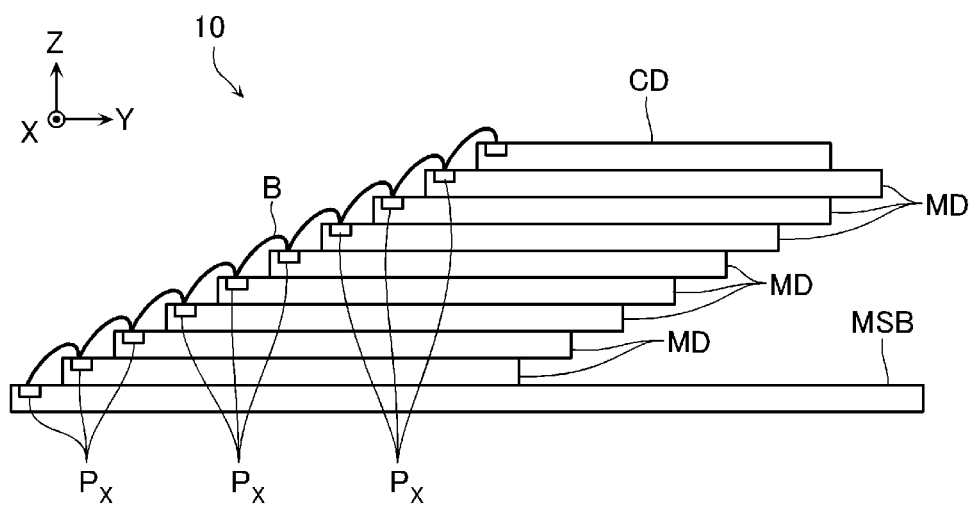
FIG. 2 illustrates a side view of an example of the memory system according to the first embodiment.
Figure 3:
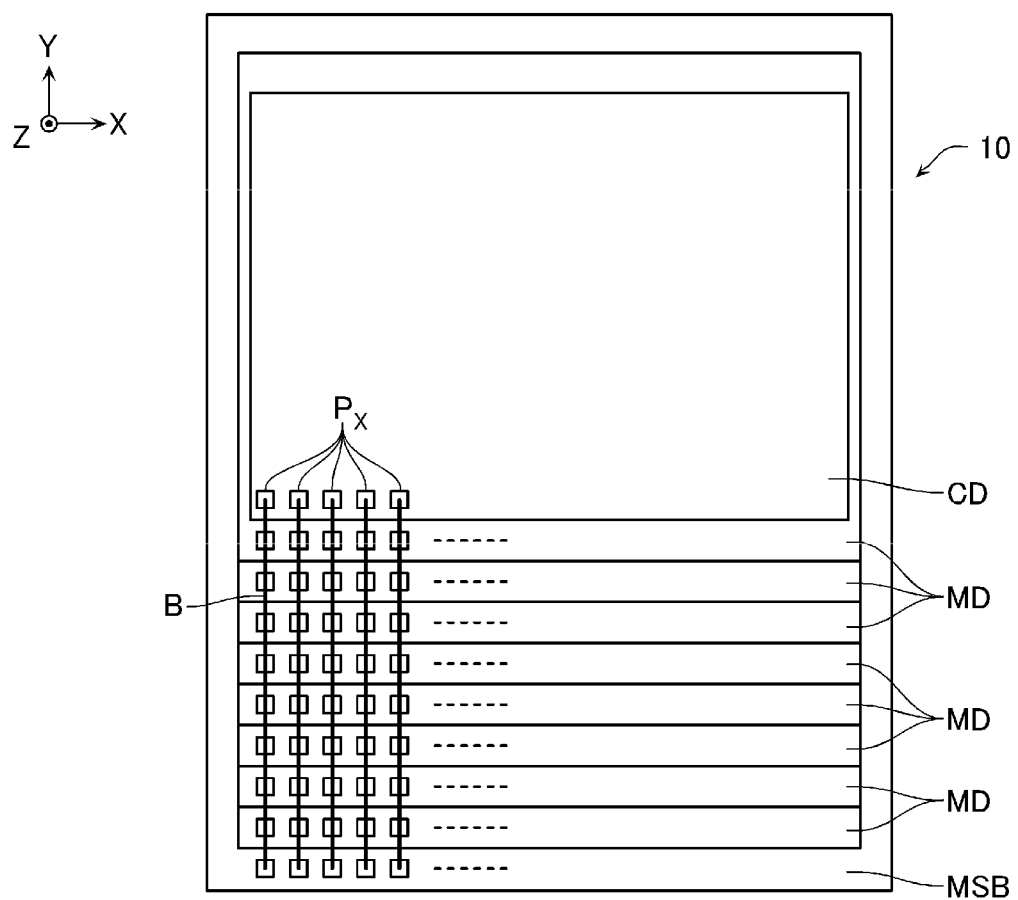
FIG. 3 illustrates a plan view of the example of the memory system according to the first embodiment.

FIG. 2 illustrates a side view of the memory system 10 according to the present embodiment. FIG. 3 illustrates a plan view of the memory system 10 according to the present embodiment. For convenience of description, illustrations of some components are omitted in FIGS. 2 and 3.

As illustrated in FIG. 2, the memory system 10 according to the present embodiment includes a mounting substrate MSB, a plurality of memory dies MD stacked on the mounting substrate MSB, and a controller die CD stacked on the memory die MD. Bonding pad electrodes $P_X$ are provided in a region of an end portion of the upper surface of the mounting substrate MSB in the Y direction. Another region of the upper surface of the mounting substrate MSB is bonded to the lower surface of the memory die MD via an adhesive or the like. Bonding pad electrodes $P_X$ are provided in the region of the end portion in the Y direction of the upper surface of the memory die MD. Another region of the upper surface of the memory die MD is bonded to the lower surface of another memory die MD or the lower surface of the controller die CD via an adhesive or the like. Bonding pad electrode $P_X$ are provided in a region of an end portion of the upper surface of the controller die CD in the Y direction.

As illustrated in FIG. 3, each of the mounting substrate MSB, the plurality of memory dies MD, and the controller die CD includes a plurality of bonding pad electrodes $P_X$ arranged in the X direction. The plurality of bonding pad electrodes $P_X$ provided on the mounting substrate MSB, the plurality of memory dies MD, and the controller die CD are connected to each other via bonding wires B.

The components illustrated in FIGS. 2 and 3 are merely an example, and the specific components may be adjusted as appropriate. For example, in the example illustrated in FIGS. 2 and 3, the controller die CD is stacked on the plurality of memory die MD, and such components are connected by bonding wires B. In such a configuration, the plurality of memory dies MD and the controller die CDs are provided in one package. Alternatively, the controller die CD may be provided in a package different from the memory die MD. Further, the plurality of memory dies MD and the controller die CDs may be connected to each other via through-electrodes or the like instead of the bonding wires B.

Circuit Configuration of Memory Die MD

Figure 4:
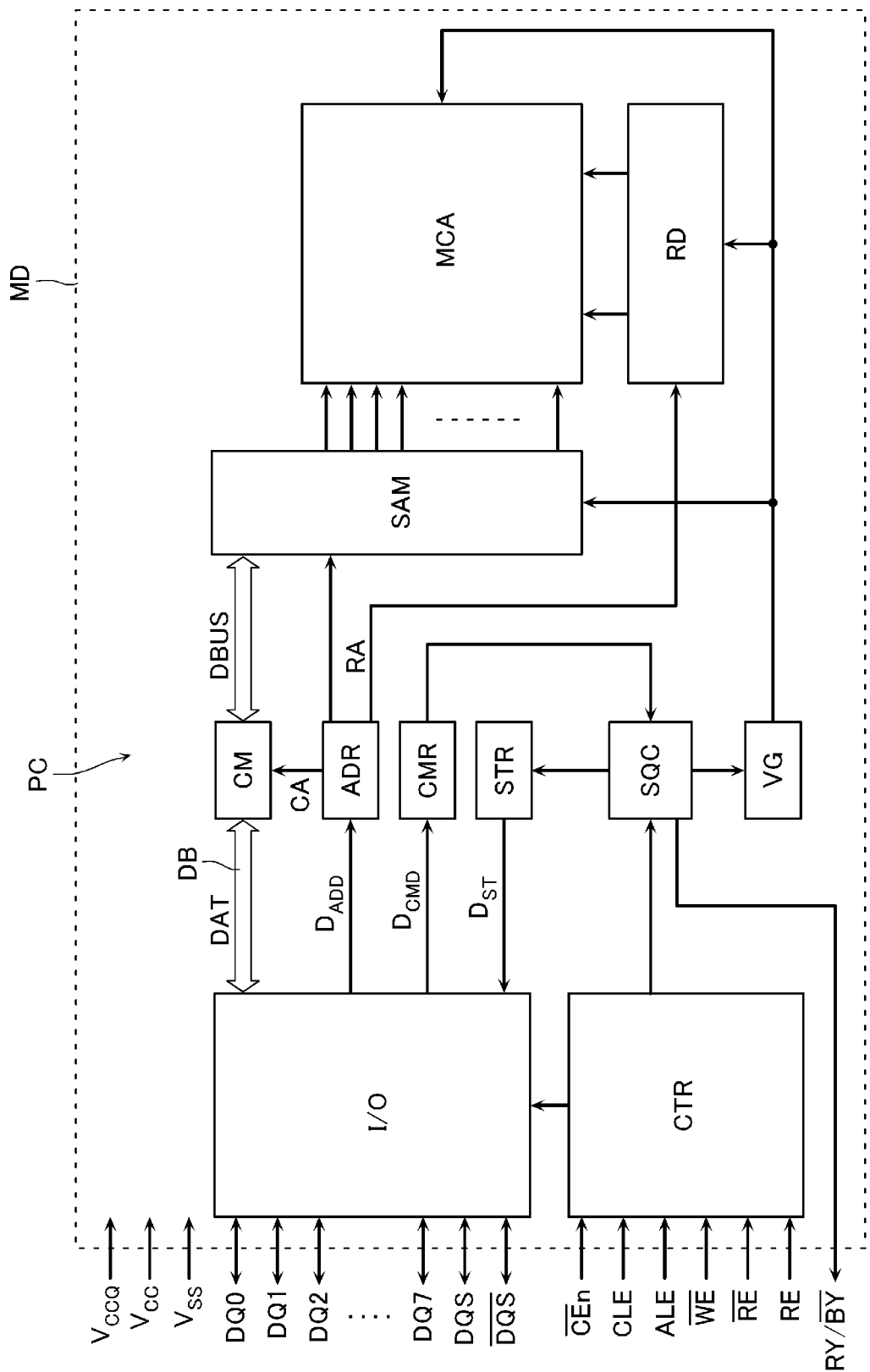
FIG. 4 is a schematic block diagram illustrating an example of a memory die in the memory system according to a first embodiment.

FIG. 4 is a schematic block diagram illustrating an example of the configuration of the memory die MD according to the first embodiment.

FIG. 4 illustrates a plurality of control terminals and the like. The plurality of control terminals may be represented as control terminals corresponding to a high active signal (positive logic signal). The plurality of control terminals may be represented as control terminals corresponding to a low active signal (negative logic signal). The plurality of control terminals may be represented as control terminals corresponding to both the high active signal and the low active signal. In FIG. 4, the reference sign of the control terminal corresponding to the low active signal includes an overline. In the present specification, the reference sign of the control terminal corresponding to the low active signal includes a slash ("/"). The illustration of FIG. 4 is an example, and the specific form may be adjusted as appropriate. For example, some or all of high active signals may be set to low active signals, or some or all of low active signals may be set to high active signals.

As illustrated in FIG. 4, the memory die MD includes a memory cell array MCA and a peripheral circuit PC. The peripheral circuit PC includes a voltage generation circuit VG, a row decoder RD, a sense amplifier module SAM, and a sequencer SQC. The peripheral circuit PC further includes a cache memory CM, an address register ADR, a command register CMR, and a status register STR. The peripheral circuit PC further includes an input/output control circuit I/O and a logic circuit CTR.

The memory cell array MCA includes a plurality of bit lines, a plurality of word lines, and a plurality of memory cells. The plurality of bit lines and the plurality of word lines are connected to the plurality of memory cells. The plurality of memory cells store data of one bit or a plurality of bits. The memory cell array MCA may include a memory transistor as a memory cell, for example. The memory transistor may have a gate insulating film including a charge storage film or another memory film.

The voltage generation circuit VG includes, for example, a step-down circuit and a step-up circuit. The step-down circuit is, for example, a regulator. The step-up circuit is, for example, a charge pump circuit. Each of the step-down circuit and the step-up circuits is connected to power-source voltage supply lines. A power-source voltage $V_{CC}$ and a ground voltage $V_{SS}$ are supplied to the power-source voltage supply lines. The power-source voltage supply lines are connected to, for example, the bonding pad electrodes $P_X$ described with reference to FIGS. 2 and 3. The voltage generation circuit VG generates a plurality of operation voltages and simultaneously outputs the generated operation voltages to a plurality of voltage supply lines, respectively. The plurality of operation voltages are supplied to the bit lines, the word lines, and the like during, for example, a read operation, a write operation, and an erasing operation on the memory cell array MCA. The operation voltage is appropriately adjusted in accordance with a control signal from the sequencer SQC.

The row decoder RD selects a word line in accordance with a row address RA included in address data $D_{ADD}$ in the address register ADR, and is electrically connected to the voltage generation circuit VG.

The sense amplifier module SAM includes, for example, a plurality of sense amplifier units. The plurality of sense amplifier units correspond to a plurality of bit lines, respectively. Each of the sense amplifier units includes a sense amplifier connected to the bit line. The sense amplifier includes a sense circuit, a latch circuit, and a voltage transfer circuit. The sense circuit includes a sense transistor and a data wiring. The gate electrode of the sense transistor is connected to the bit line. The drain electrode of the sense transistor is connected to the data wiring. The sense transistor turns into the ON state in accordance with the voltage or the current of the bit line. The data wiring is charged or discharged in accordance with the ON/OFF state of the sense transistor. The latch circuit latches data of "1" or "0" in accordance with the voltage of the data wiring. The voltage transfer circuit causes the bit line to be electrically connected to one of the two voltage supply lines in accordance with the data latched by the latch circuit.

The cache memory CM includes a plurality of latch circuits. The plurality of latch circuits are connected to the latch circuit in the sense amplifier module SAM via a wiring DBUS. Pieces of data DAT in the plurality of latch circuits are subsequently transferred to the sense amplifier module SAM or the input/output control circuit I/O.

A decoding circuit (not illustrated) and a switch circuit (not illustrated) are connected to the cache memory CM. The decoding circuit decodes a column address CA included in the address data $D_{ADD}$ in the address register ADR. The switch circuit causes the latch circuit corresponding to the column address CA to be electrically connected to a bus DB in accordance with the output signal of the decoding circuit.

The sequencer SQC outputs an internal control signal to the row decoder RD, the sense amplifier module SAM, and the voltage generation circuit VG in accordance with command data $D_{CMD}$ stored in the command register CMR. The sequencer SQC outputs status data $D_{ST}$ indicating the state of the sequencer itself to the status register STR as appropriate.

The sequencer SQC generates a ready/busy signal and outputs the generated ready/busy signal to a terminal RY/(/BY). During a period (busy period) in which the terminal RY/(/BY) is in the "L" state, an access to the memory die MD is basically prohibited. During a period (ready period) in which the terminal RY/(/BY) is in the "H" state, the access to the memory die MD is permitted. The terminal RY/(/BY) is implemented, for example, by the bonding pad electrode $P_X$ described with reference to FIGS. 2 and 3.

The input/output control circuit I/O is a portion of a high-speed I/F (interface) circuit (not illustrated). The high-speed I/F circuit inputs and outputs data via the input/output control circuit I/O.

The input/output control circuit I/O includes data signal input/output terminals DQ0 to DQ7, toggle signal input/output terminals DQS, /DQS, a plurality of input circuits, a plurality of output circuits, a shift register, and a buffer circuit. The plurality of input circuits include, for example, a comparator and the like. The plurality of output circuits include, for example, an off chip driver (OCD) circuit and the like. The plurality of input circuits, the plurality of output circuits, the shift register, and the buffer circuit are connected to terminals to which the power-source voltage $V_{CCQ}$ and the ground voltage $V_{SS}$ are supplied, respectively.

The data signal input/output terminals DQ0 to DQ7, the toggle signal input/output terminals DQS, /DQS, and the terminals to which the power-source voltage $V_{CCQ}$ and the ground voltage $V_{SS}$ are supplied are implemented, for example, by the bonding pad electrodes $P_X$ described with reference to FIGS. 2 and 3. Data input via the data signal input/output terminals DQ0 to DQ7 is output from the buffer circuit to the cache memory CM, the address register ADR, or the command register CMR in accordance with the internal control signal from the logic circuit CTR. Data output via the data signal input/output terminals DQ0 to DQ7 is input to the buffer circuit from the cache memory CM or the status register STR in accordance with the internal control signal from the logic circuit CTR.

The logic circuit CTR receives an external control signal from the controller die CD via external control terminals /CEn, CLE, ALE, /WE, /RE, and RE, and outputs the internal control signal to the input/output control circuit I/O in response to the reception. The external control terminals /CEn, CLE, ALE, /WE, /RE, and RE are implemented, for example, by the bonding pad electrodes $P_X$ described with reference to FIGS. 2 and 3.

Structure of Memory Die MD

Figure 5:
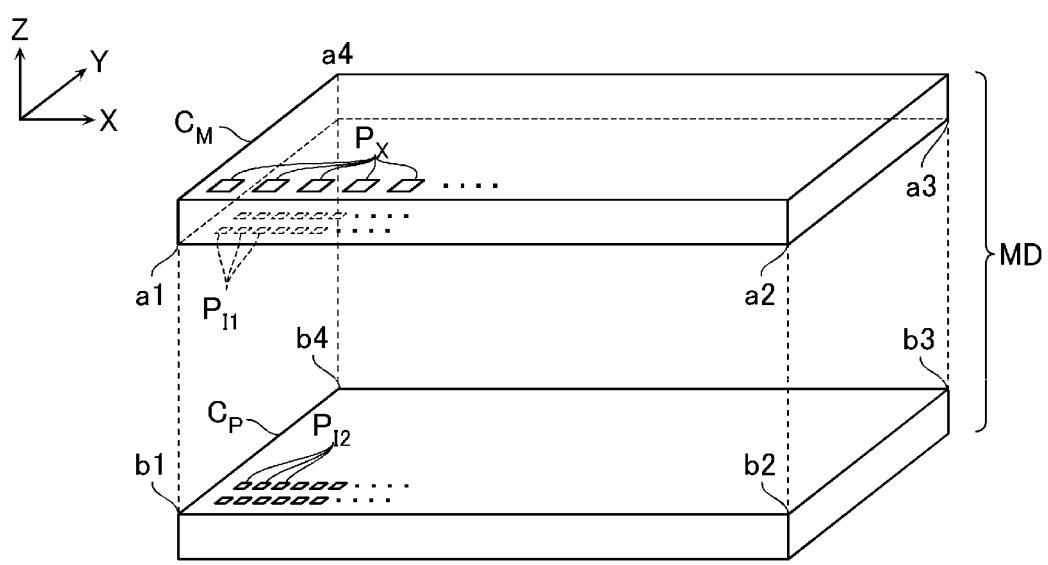
FIG. 5 illustrates an exploded perspective view of an example of a semiconductor storage device according to the first embodiment.

FIG. 5 illustrates an exploded perspective view of a semiconductor storage device according to the present embodiment. As illustrated in FIG. 5, the memory die MD includes a chip $C_M$ including a memory cell array MCA and a chip $C_P$ including peripheral circuits.

The plurality of bonding pad electrodes $P_X$ are provided on the upper surface of the chip $C_M$. A plurality of bonding electrodes $P_{I1}$ are provided on the lower surface of the chip $C_M$. A plurality of bonding electrodes $P_{I2}$ are provided on the upper surface of the chip $C_P$. Regarding the chip $C_M$, a surface on which the plurality of bonding electrodes $P_{I1}$ are provided is referred to as a front surface, and a surface on which the plurality of bonding pad electrode $P_X$ are provided is referred to as a rear surface. Regarding the chip $C_P$, a surface on which the plurality of bonding electrodes $P_{I2}$ are provided is referred to as a front surface, and a surface on the opposite side of the front surface is referred to as a rear surface. In the example illustrated in FIG. 5, the front surface of the chip $C_P$ is provided above the rear surface of the chip $C_P$, and the rear surface of the chip $C_M$ is the provided above the front surface of the chip $C_M$.

The chip $C_M$ and the chip $C_P$ are disposed so that the front surface of the chip $C_M$ faces the front surface of the chip $C_P$. The plurality of bonding electrodes $P_{I1}$ are provided respectively corresponding to the plurality of bonding electrodes $P_{I2}$, and are arranged at locations bondable to the plurality of bonding electrodes $P_{I2}$. The bonding electrodes $P_{I1}$ and the bonding electrodes $P_{I2}$ function as bonding electrodes for bonding the chip $C_M$ and the chip $C_P$ to each other and causing the chip $C_M$ and the chip $C_P$ to be electrically connected to each other. The bonding pad electrode $P_X$ functions as the bonding pad electrode $P_X$ described with reference to FIGS. 2 and 3.

In the example of FIG. 5, corners a1, a2, a3, and a4 of the chip $C_M$ correspond to corners b1, b2, b3, and b4 of the chip $C_P$, respectively.

Figure 6:
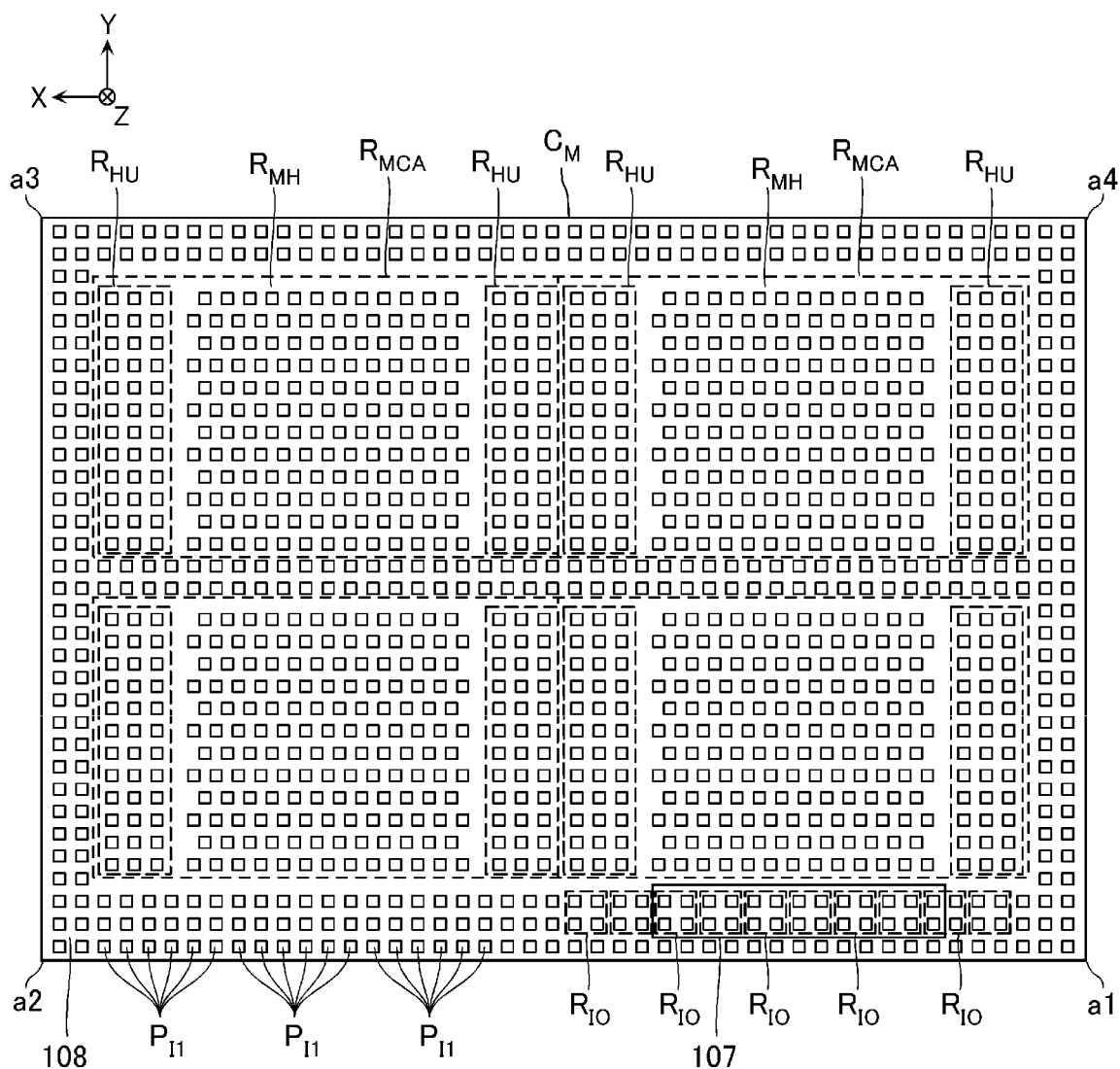
FIG. 6 illustrates a bottom view of an example of a chip $C_M$ of the semiconductor storage device.
Figure 7:
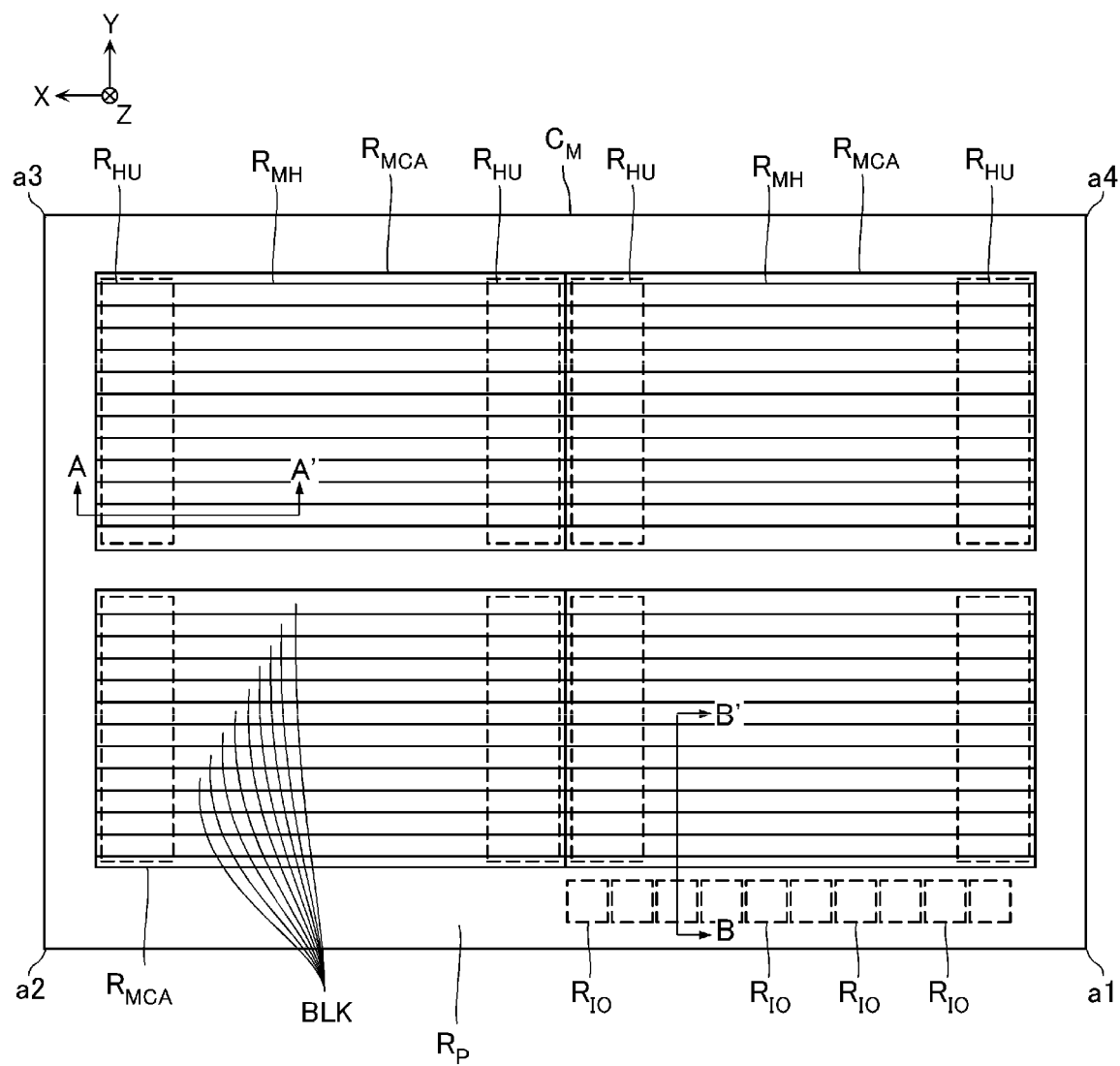
FIG. 7 illustrates an internal structure of an example of the chip $C_M$.
Figure 8:
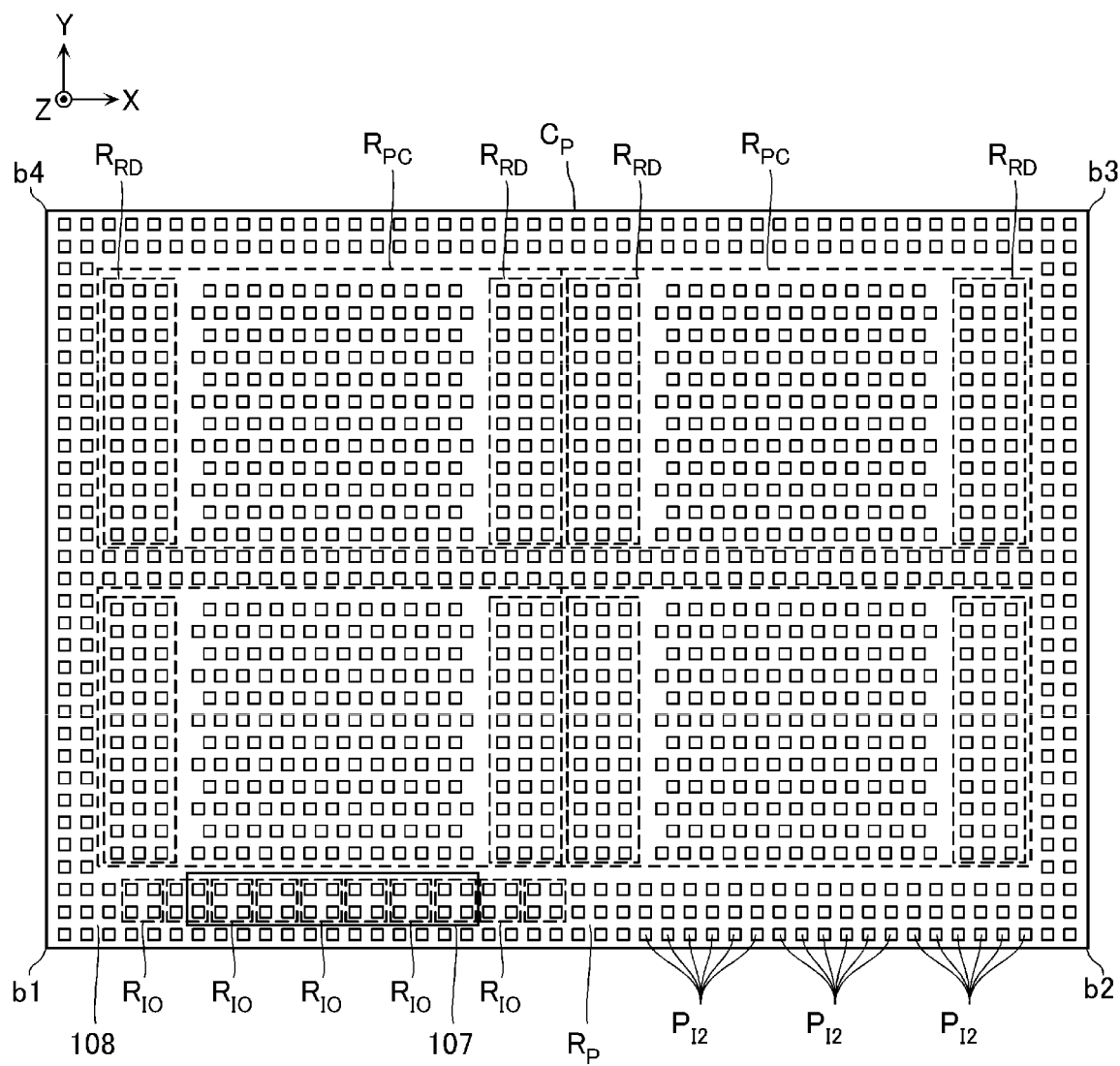
FIG. 8 illustrates a plan view of an example of a chip $C_P$ of the semiconductor storage device.
Figure 9:
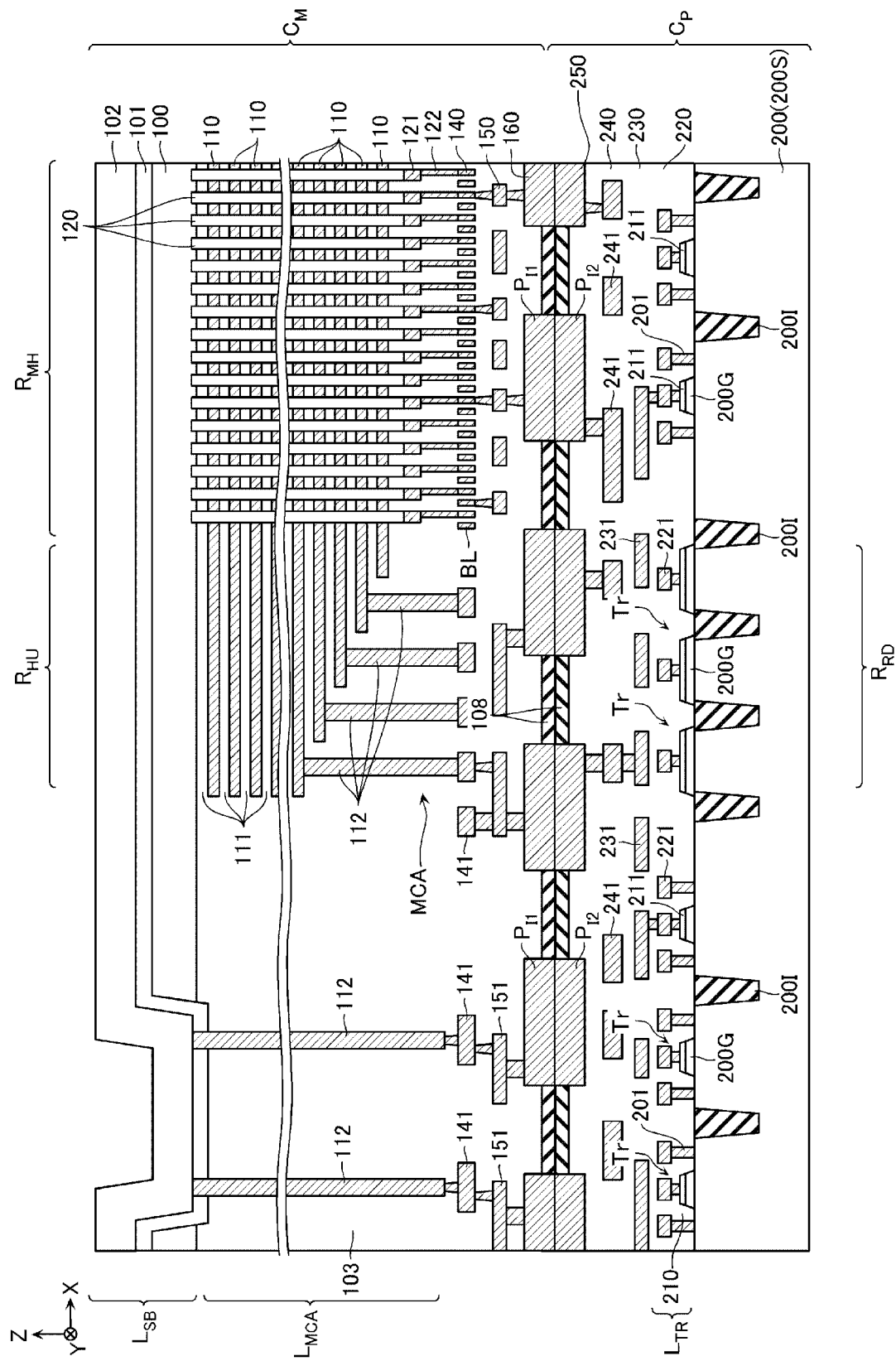
FIG. 9 illustrates a schematic cross-sectional view of the chip $C_M$ corresponding to line A-A' in FIG. 7.
Figure 10:
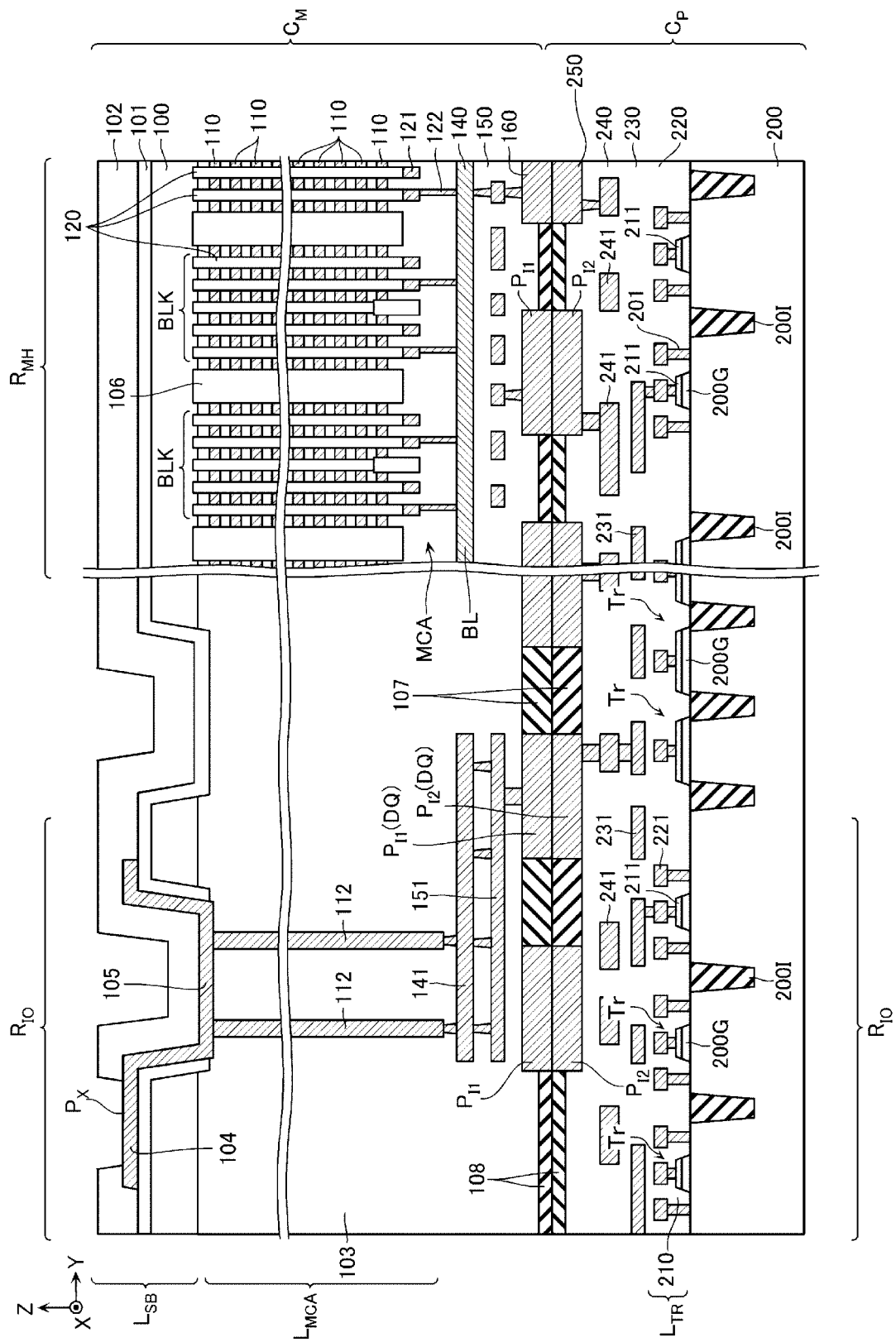
FIG. 10 illustrates a schematic cross-sectional view of the chip $C_M$ corresponding to line B-B' in FIG. 7.
Figure 11:
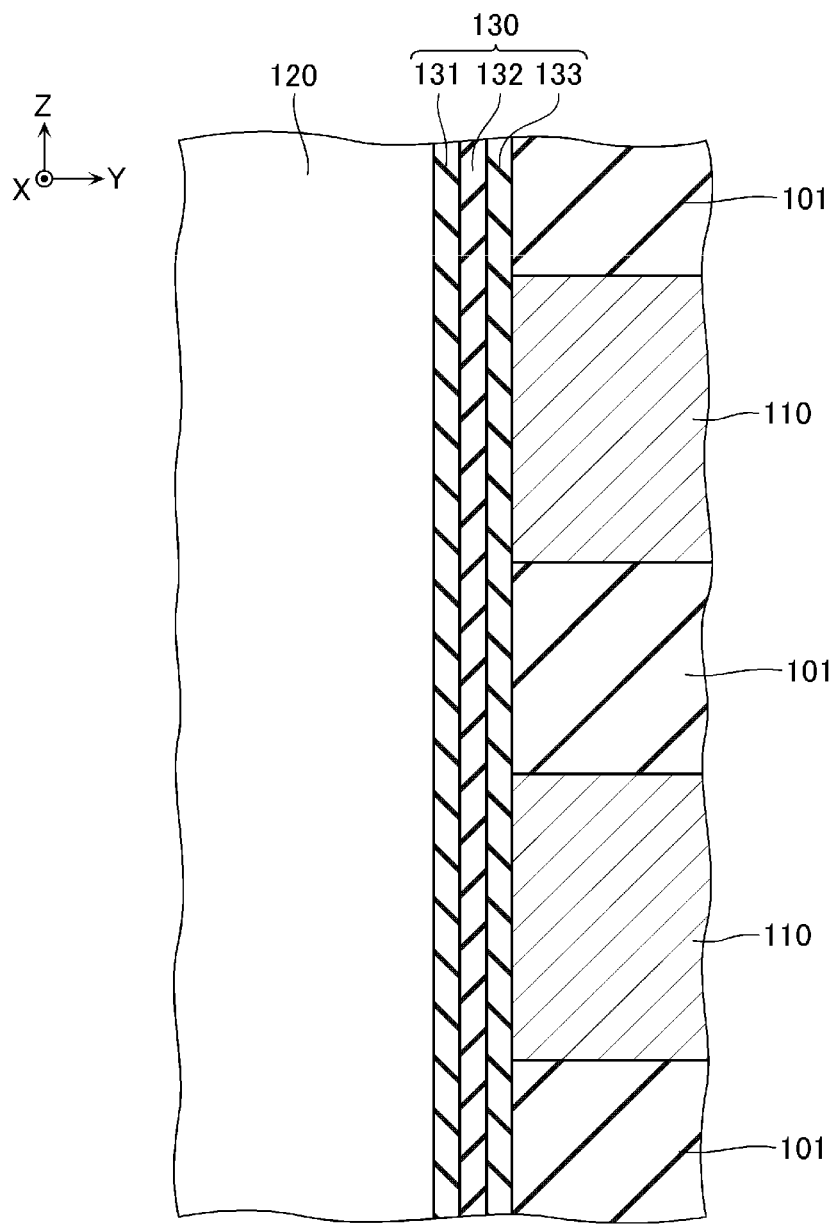
FIG. 11 illustrates an enlarged view of a part of the chip $C_M$ illustrated in FIG. 10.
Figure 12:
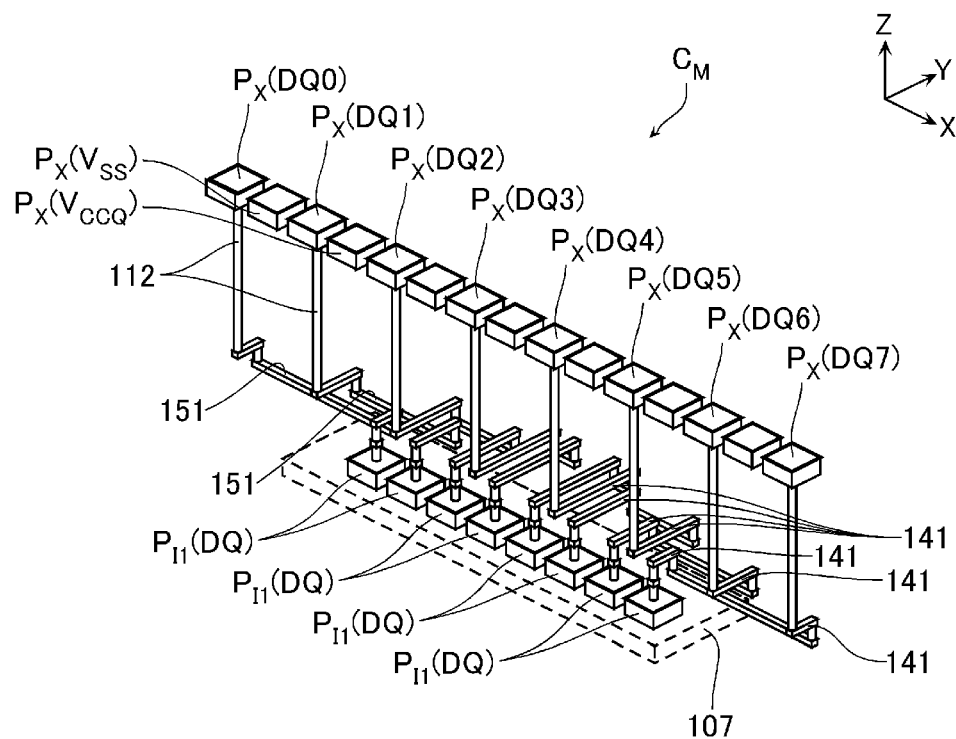
FIG. 12 illustrates a perspective view of a part of the chip $C_M$.
Figure 13:
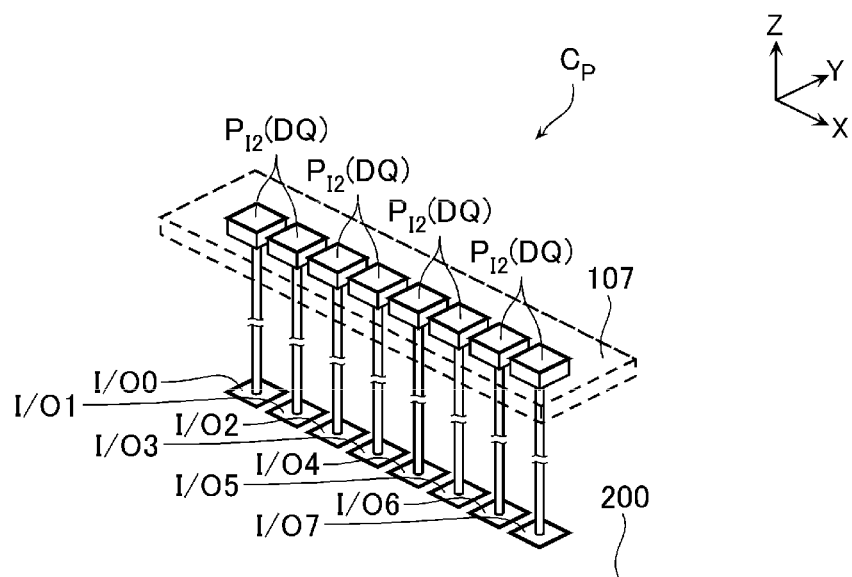
FIG. 13 illustrates a perspective view a part of the chip $C_P$.
Figure 14:
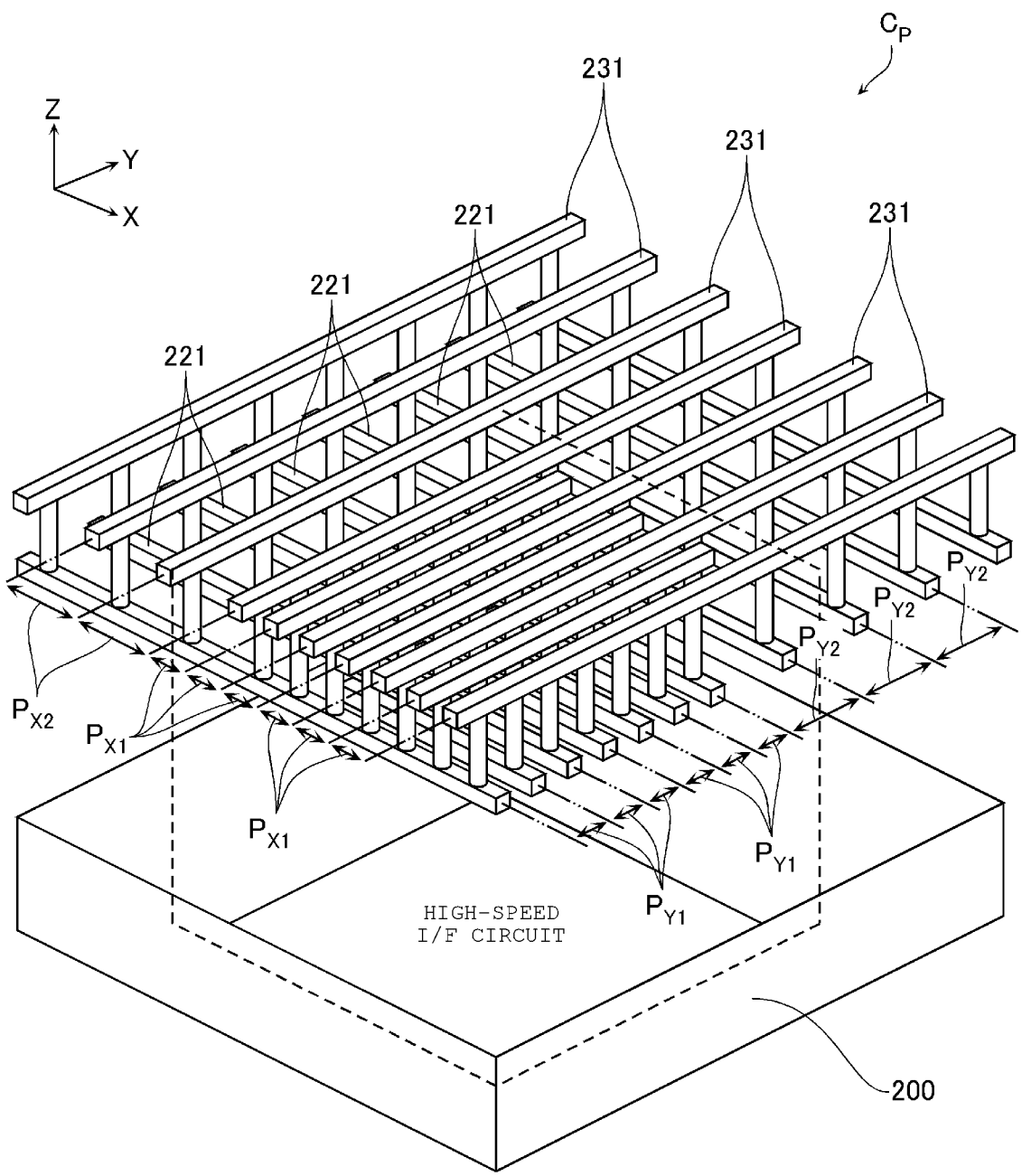
FIG. 14 illustrates a perspective view of another part of the chip $C_P$.

FIG. 6 illustrates a bottom view of the chip $C_M$. FIG. 7 illustrates an internal structure of the front surface of the chip $C_M$ on which the plurality of bonding electrodes $P_{I1}$ is provided. FIG. 8 illustrates a plan view of the chip $C_P$. FIG. 9 illustrates a schematic cross-sectional view of the chip $C_M$ corresponding to line IX-IX' in FIG. 7. FIG. 10 illustrates a schematic cross-sectional view of the chip $C_M$ corresponding to line X-X' in FIG. 7. FIG. 11 illustrates an enlarged view of a part of the chip $C_M$ in FIG. 10. FIG. 12 illustrates a perspective view of another part of the chip $C_M$. FIGS. 13 and 14 illustrate perspective views of parts of the chip $C_P$.

Structure of Chip $C_M$

For example, as illustrated in FIG. 7, the chip $C_M$ includes four memory cell array regions $R_{MCA}$ arranged in the X direction and the Y direction. The memory cell array region $R_{MCA}$ includes a memory hole region $R_{MH}$ in which the memory transistor is provided, and a hookup region $R_{HU}$ provided on one side (for example, positive side in the X direction in FIG. 7) and the other side (for example, negative side in the X direction in FIG. 7) of the memory hole region $R_{MH}$ in the X direction. The chip $C_M$ includes a peripheral region $R_P$ provided in a region outside the four memory cell array regions $R_{MCA}$ (in the example illustrated in FIG. 7, region between the two memory cell array regions $R_{MCA}$ arranged in the Y direction, region between the memory cell array region $R_{MCA}$ and the end portion of the chip $C_M$ in the Y direction, and region between the memory cell array region $R_{MCA}$ and the end portion of the chip $C_M$ in the X direction). Further, a plurality of input/output circuit regions $R_{IO}$ provided corresponding to the plurality of bonding pad electrodes $P_X$ (FIGS. 2, 3, and 5) are provided in a portion of the peripheral region $R_P$.

In the example illustrated in FIG. 7, the hookup region $R_{HU}$ is provided on one side and the other side of the memory hole region $R_{MH}$ in the X direction. Such a configuration is just an example, and the specific configuration may be appropriately adjusted. For example, the hookup region $R_{HU}$ may be provided at the center position of the memory cell array region $R_{MCA}$ in the X direction or at a position near the center thereof.

As illustrated in FIGS. 9 and 10, the chip $C_M$ includes a base layer $L_{SB}$, a memory cell array layer $L_{MCA}$ provided below the base layer $L_{SB}$, and a plurality of wiring layers 140, 150, and 160 provided below the memory cell array layer $L_{MCA}$.

Structure of Base Layer $L_{SB}$ of Chip $C_M$

For example, as illustrated in FIG. 9, the base layer $L_{SB}$ includes a semiconductor layer 100, an insulating layer 101 provided on the upper surface of the semiconductor layer 100, and an insulating layer 102 provided on the upper surface of the insulating layer 101. For example, as illustrated in FIG. 10, the bonding pad electrode $P_X$ provided between the insulating layer 101 and the insulating layer 102 is provided in the input/output circuit region $R_{IO}$.

The semiconductor layer 100 is, for example, a semiconductor layer made of silicon (Si) or the like in which N-type impurities such as phosphorus (P) or P-type impurities such as boron (B) are injected. In addition, for example, a layer of metal such as tungsten (W) or a silicide such as tungsten silicide (WSi) may be provided between the semiconductor layer 100 and the insulating layer 101. The semiconductor layer 100 is provided in a plurality of regions spaced from each other in the X direction or the Y direction. For example, the semiconductor layer 100 is provided in each of four regions corresponding to the four memory cell array regions $R_{MCA}$ described with reference to FIG. 7.

The insulating layer 101 is an insulating layer formed of an insulating material such as silicon oxide ($SiO_2$), for example. As illustrated in FIGS. 9 and 10, for example, the insulating layer 101 covers the entirety of the upper surface and the side surface of the semiconductor layer 100 and the upper surface of an insulating layer 103, which is made of silicon oxide ($SiO_2$) or the like and provided in the memory cell array layer $L_{MCA}$.

The insulating layer 102 is a passivation layer formed of an insulating material such as polyimide.

The bonding pad electrode $P_X$ contains a conductive material such as aluminum (Al). For example, as illustrated in FIG. 10, the bonding pad electrode $P_X$ includes an external connection region 104 provided on the upper surface of the semiconductor layer 100 via the insulating layer 101 and an internal connection region 105 provided on the upper surface of the insulating layer 103 in the memory cell array layer $L_{MCA}$.

The external connection region 104 is a region connected to the bonding wire B (FIGS. 2 and 3). An opening is provided in at least a portion of the insulating layer 102 corresponding to the external connection region 104. The external connection region 104 is exposed to a region outside the memory die MD through such an opening.

The internal connection region 105 is a region connected to a contact 112 in the memory cell array layer $L_{MCA}$. The internal connection region 105 is provided below the external connection region 104.

Structure of Memory Cell Array Layer $L_{MCA}$ of Chip $C_M$

For example, as illustrated in FIG. 10, the memory cell array MCA is provided in the memory cell array region $R_{MCA}$ (FIG. 7) of the memory cell array layer $L_{MCA}$. The memory cell array MCA includes a plurality of memory blocks BLK arranged in the Y direction, and an inter-block insulating layer 106, which is made of silicon oxide ($SiO_2$) or the like and provided between the plurality of memory blocks BLK.

A portion of the memory block BLK, which is provided in the memory hole region $R_{MH}$, includes a plurality of conductive layers 110 arranged in the Z direction, a plurality of semiconductor layers 120 extending in the Z direction, and a plurality of gate insulating films 130 (FIG. 11) respectively provided between the plurality of conductive layers 110 and the plurality of semiconductor layers 120.

As illustrated in FIG. 9, for example, the conductive layer 110 is a substantially plate-shaped conductive layer extending in the X direction. The conductive layer 110 may include a stacked film of a barrier conductive film made of titanium nitride (TiN) or the like and a metal film made of tungsten (W) or the like. The conductive layer 110 may contain, for example, polycrystalline silicon containing impurities such as phosphorus (P) or boron (B). Insulating layers 111 made of silicon oxide ($SiO_2$) or the like are provided between the plurality of conductive layers 110 arranged in the Z direction. The plurality of conductive layers 110 function as, for example, word lines and gate electrodes of a plurality of memory transistors connected to the word lines.

The semiconductor layer 120 functions as, for example, channel regions of a plurality of memory transistors. The semiconductor layer 120 is a semiconductor layer made of polycrystalline silicon (Si), for example. The semiconductor layer 120 has, for example, a substantially columnar shape. An outer peripheral surface of each of the semiconductor layers 120 is surrounded by the conductive layer 110 and faces the conductive layer 110.

An impurity region (not illustrated) containing N-type impurities such as phosphorus (P) is provided at a lower end portion of the semiconductor layer 120. The impurity region is connected to the bit line BL via a contact 121 and a contact 122.

An impurity region (not illustrated) containing N-type impurities such as phosphorus (P) or P-type impurities such as boron (B) is provided in the upper end portion of the semiconductor layer 120. Such an impurity region is connected to the semiconductor layer 100.

The gate insulating film 130 (FIG. 11) has a substantially bottomed cylindrical shape that covers the outer peripheral surface of the semiconductor layer 120. For example, the gate insulating film 130 includes a tunnel insulating film 131, a charge storage film 132, and a block insulating film 133, which are stacked between the semiconductor layer 120 and the conductive layer 110. The tunnel insulating film 131 and the block insulating film 133 are insulating films made of silicon oxide ($SiO_2$), for example. The charge storage film 132 is a film that is made of silicon nitride ($Si_3N_4$) and is capable of storing charges, for example. The tunnel insulating film 131, the charge storage film 132, and the block insulating film 133 have a substantially cylindrical shape, and extend in the Z direction along the outer peripheral surface of the semiconductor layer 120.

FIG. 11 illustrates an example in which the gate insulating film 130 includes the charge storage film 132 made of silicon nitride or the like. Alternatively, the gate insulating film 130 may include, for example, a floating gate made of polycrystalline silicon containing N-type or P-type impurities.

As illustrated in FIG. 9, for example, a portion of the memory block BLK, which is provided in the hookup region $R_{HU}$ includes end portions of the plurality of conductive layers 110 arranged in the Z direction, in the X direction, and a plurality of contacts 112 extending in the Z direction.

The conductive layer 110 has a substantially stepped structure in the hookup region $R_{HU}$. That is, the position of the lower conductive layer 110 provided at the end portion in the X direction is closer to the memory hole region $R_{MH}$, and the position of the upper conductive layer 110 provided at the end portion in the X direction is farther from the memory hole region $R_{MH}$.

The contact 112 includes, for example, a stacked film of a barrier conductive film made of titanium nitride (TiN) or the like and a metal film made of tungsten (W) or the like. The contact 112 has, for example, a substantially columnar shape. A plurality of contacts 112 are connected to the different conductive layers 110 at the upper ends. The plurality of contacts 112 are connected to the different wirings 141 at the lower ends.

The input/output circuit region $R_{IO}$ of the memory cell array layer $L_{MCA}$ includes another plurality of contacts 112 extending in the Z direction, for example, as illustrated in FIG. 10. As described above, the upper ends of the plurality of contacts 112 are connected to the lower surface of the internal connection region 105 of the bonding pad electrodes $P_X$, respectively. The plurality of contacts 112 are connected to wirings 141 at the lower end, respectively.

Structure of Wiring Layers 140, 150, and 160 of Chip $C_M$

The plurality of wirings in the wiring layers 140, 150, and 160 are electrically connected to at least one of the components in the memory cell array layer $L_{MCA}$ and the components in the chip $C_P$, for example.

The wiring layer 140 includes a plurality of wirings 141. The plurality of wirings 141 may include, for example, a stacked film of a barrier conductive film made of titanium nitride (TiN) or the like and a metal film made of copper (Cu) or the like. The plurality of wirings 141 are mainly arranged in the X direction and extend in the Y direction. Some of the plurality of wirings 141 function as the bit lines BL. For example, the bit lines BL are arranged in the X direction as illustrated in FIG. 9 and extend in the Y direction as illustrated in FIG. 10. The plurality of bit lines BL are connected to the plurality of semiconductor layers 120, respectively.

The wiring layer 150 includes a plurality of wirings 151. The plurality of wirings 151 may include, for example, a stacked film of a barrier conductive film made of titanium nitride (TiN) or the like and a metal film made of copper (Cu) or the like. The plurality of wirings 151 are arranged mainly in the Y direction and extend in the X direction. Some of the wirings 151 may be arranged in the X direction and extended in the Y direction. Some of the wirings 151 may include a wiring extending in the X direction and a wiring extending in the Y direction.

The wiring layer 160 includes a plurality of bonding electrodes $P_{I1}$. The plurality of bonding electrodes $P_{I1}$ may include, for example, a stacked film of a barrier conductive film made of titanium nitride (TiN), or the like and a metal film made of copper (Cu), or the like.

Here, as illustrated in FIG. 6, the plurality of bonding electrodes $P_{I1}$ are provided in the input/output circuit region $R_{IO}$. The plurality of bonding electrodes $P_{I1}$ are electrically connected to the bonding pad electrodes $P_X$ via the contacts 112 described with reference to FIG. 10.

In the following description, among the plurality of bonding pad electrodes $P_X$, one that functions as any of the data signal input/output terminals DQ0 to DQ7, or one that functions as the toggle signal input/output terminal DQS or /DQS may be referred to as a bonding pad electrode $P_X$ (DQ). Among the plurality of bonding pad electrodes $P_X$, one to which the ground voltage $V_{SS}$ is supplied may be referred to as a bonding pad electrode $P_X$ ($V_{SS}$). Further, among the plurality of bonding pad electrodes $P_X$, one to which the power supply voltage $V_{CCQ}$ is supplied may be referred to as a bonding pad electrode $P_X$ ($V_{CCQ}$). In the following description, among the plurality of bonding electrodes $P_{I1}$, one that is electrically connected to the bonding pad electrode $P_X$ (DQ) may be referred to as a bonding electrode $P_{I1}$ (DQ).

In the example of FIG. 10, the lower surface of the chip $C_M$ includes the lower surfaces of the plurality of bonding electrodes $P_{I1}$, the lower surface of the insulating layer 107, and the lower surface of the insulating layer 108. The area of the insulating layer 107 on the lower surface of the chip $C_M$ is smaller than the area of the insulating layer 108 on the lower surface of the chip $C_M$.

The insulating layer 107 is provided, for example, in a region near a region in which the lower surfaces of the plurality of bonding electrodes $P_{I1}$ (DQ) are provided, on the lower surface of the chip $C_M$. For example, as illustrated in FIG. 6, the entire periphery of the outer edges of the plurality of bonding electrodes $P_{I1}$ (DQ) on the lower surface of the chip $C_M$ are surrounded by the insulating layer 107. The insulating layer 107 is formed of a low dielectric constant insulating layer. The low dielectric constant insulating layer is, for example, an insulating layer having a relative dielectric constant which is equal to or smaller than 4.0. For example, the insulating layer 107 may be made of carbon-containing silicon oxide (SiOC) or fluorine-containing silicon oxide (SiOF), and another low dielectric constant insulating layer may be used.

The insulating layer 108 is provided, for example, in a region other than a region in which the lower surfaces of the plurality of bonding electrodes $P_{I1}$ are provided and a region in which the lower surface of the insulating layer 107 is provided, on the lower surface of the chip $C_M$. The insulating layer 108 is provided in a region farther from the plurality of bonding electrodes $P_{I1}$ (DQ) than the insulating layer 107. On the lower surface of the chip $C_M$, the entire periphery of the outer edges of the plurality of bonding electrodes $P_{I1}$ other than the plurality of bonding electrodes $P_{I1}$ (DQ) are surrounded by the insulating layer 108. The insulating layer 108 may be formed of, for example, silicon oxide ($SiO_2$), silicon nitride (SiN), or another insulating layer. The insulating layer 108 may be a portion of the insulating layer 103 or may be omitted, for example. The relative dielectric constant of the insulating layer 108 is greater than the relative dielectric constant of the insulating layer 107. The relative dielectric constant of the insulating layer 108 is equal to or greater than 4.0, for example.

In the example of FIG. 12, a plurality of bonding pad electrodes $P_X$ (DQ) are arranged at predetermined intervals in the X direction. A plurality of bonding electrodes $P_{I1}$ (DQ) connected to the plurality of bonding pad electrodes $P_X$ (DQ) are arranged at predetermined intervals in the X direction.

FIG. 12 illustrates wirings provided on the current path between the bonding pad electrode $P_X$ (DQ) and the bonding electrode $P_{I1}$ (DQ) among the plurality of wirings 141 and 151. In the present embodiment, the wirings between the bonding pad electrodes $P_X$ (DQ) and the bonding electrodes $P_{I1}$ (DQ) are three-dimensional wirings having a large-scale integrated circuit (LSI) wiring structure. It is desirable to form the wirings so that the wiring lengths of the wirings are as equal to each other as possible to achieve a high-speed signal operation of I/O0 to I/O7, which will be described below.

The wiring length between the bonding pad electrode $P_X$ (DQ) and the bonding electrode $P_{I1}$ (DQ) may be, for example, the sum of the length, in the X direction, of the wiring extending in the X direction and the length, in the Y direction, of the wiring extending in the Y direction among the plurality of wirings 141 and 151 provided in the current path between the bonding pad electrode $P_X$ (DQ) and the bonding electrode $P_{I1}$ (DQ).

Structure of Chip $C_P$

As illustrated in FIG. 8, for example, the chip $C_P$ has four circuit regions $R_{PC}$ provided at positions corresponding to the four memory cell array regions $R_{MCA}$ (FIG. 7). The circuit region $R_{PC}$ includes row decoder regions $R_{RD}$ provided at positions corresponding to the two hookup regions $R_{HU}$. The chip $C_P$ includes a peripheral region $R_P$ corresponding to the peripheral region $R_P$ (FIG. 7) of the chip $C_M$, and a plurality of input/output circuit regions $R_{IO}$ provided to correspond to the plurality of input/output circuit regions $R_{IO}$ (FIG. 7) of the chip $C_M$. The plurality of input/output circuit regions $R_{IO}$ (FIG. 7) of the chip $C_M$ and the plurality of input/output circuit regions $R_{IO}$ of the chip $C_P$ may be provided at positions at which both input/output circuit regions overlap each other, or may be provided at positions at which both input/output circuit regions do not overlap each other, when viewed in the Z direction.

For example, as illustrated in FIGS. 9 and 10, the chip $C_P$ includes a semiconductor substrate 200 and a transistor layer $L_{TR}$ provided above the semiconductor substrate 200, and a plurality of wiring layers 220, 230, 240, 250 provided above the transistor layer $L_{TR}$.

Structure of Semiconductor Substrate 200 of Chip $C_P$

The semiconductor substrate 200 is a semiconductor substrate configured with P-type silicon (Si) containing P-type impurities such as boron (B), for example. A semiconductor substrate region 200S and an insulating region 200I are provided on the surface of the semiconductor substrate 200.

Structure of Transistor Layer $L_{TR}$ of Chip $C_P$

An electrode layer 210 is provided on the upper surface of the semiconductor substrate 200 via an insulating layer 200G. The electrode layer 210 includes a plurality of electrodes 211 facing the surface of the semiconductor substrate 200. Regions of the semiconductor substrate 200 and the plurality of electrodes 211 in the electrode layer 210 are connected to contacts 201, respectively.

The semiconductor substrate region 200S of the semiconductor substrate 200 functions as a channel region or the like of a plurality of transistors Tr constituting the peripheral circuit.

The plurality of electrodes 211 in the electrode layer 210 function as gate electrodes or the like of the plurality of transistors Tr constituting the peripheral circuit, respectively. The electrode 211 includes, for example, a semiconductor layer made of polycrystalline silicon (Si) or the like, which contains N-type impurities such as phosphorus (P) or P-type impurities such as boron (B), and a metal layer made of tungsten (W) or the like, which is provided on the upper surface of the semiconductor layer.

The contact 201 extends in the Z direction and is connected to the upper surface of the semiconductor substrate 200 or the upper surface of the electrode 211 at the lower end of the contact 201. The contact 201 may include, for example, a stacked film of a barrier conductive film made of titanium nitride (TiN) or the like and a metal film made of tungsten (W) or the like.

Each of the plurality of transistors Tr provided on the semiconductor substrate 200 constitutes a portion of the peripheral circuit. For example, the plurality of transistors Tr provided in the row decoder region $R_{RD}$ (FIG. 8) constitute a portion of the row decoder RD (FIG. 4). For example, some of the plurality of transistors Tr provided in the region corresponding to the memory hole region $R_{MH}$ constitute a portion of the sense amplifier module SAM (FIG. 4) and the cache memory CM. For example, the plurality of transistors Tr provided in the input/output circuit region $R_{IO}$ (FIG. 8) constitute a portion of the input/output control circuit I/O (FIG. 4).

Structure of Wiring Layers 220, 230, 240, and 250 of Chip $C_P$

The plurality of wirings in the wiring layers 220, 230, 240, and 250 are electrically connected to at least one of the components in the transistor layer $L_{TR}$ and the components in the chip $C_M$, for example.

The wiring layer 220 includes a plurality of wirings 221. The plurality of wirings 221 may include, for example, a stacked film of a barrier conductive film made of titanium nitride (TiN) or the like and a metal film made of copper (Cu) or the like.

The wiring layer 230 includes a plurality of wirings 231. The plurality of wirings 231 may include, for example, a stacked film of a barrier conductive film made of titanium nitride (TiN) or the like and a metal film made of copper (Cu) or the like.

The wiring layer 240 includes a plurality of wirings 241. The plurality of wirings 241 may include, for example, a stacked film of a barrier conductive film made of titanium nitride (TiN) or the like and a metal film made of copper (Cu) or the like.

The wiring layer 250 includes a plurality of bonding electrodes $P_{I2}$. The plurality of bonding electrodes $P_{I2}$ may include, for example, a stacked film of a barrier conductive film made of titanium nitride (TiN), or the like and a metal film made of copper (Cu), or the like.

Here, as illustrated in FIG. 8, the plurality of bonding electrodes $P_{I2}$ are provided in the input/output circuit region $R_{IO}$. The plurality of bonding electrodes $P_{I2}$ are electrically connected to the transistors Tr constituting the input/output circuit via the contacts 201 described with reference to FIG. 10. The plurality of bonding electrodes $P_{I2}$ are electrically connected to the bonding pad electrodes $P_X$ via the bonding electrodes $P_{I1}$.

In the following description, among the plurality of bonding electrodes $P_{I2}$, one that is electrically connected to the bonding pad electrode $P_X$ (DQ) may be referred to as a bonding electrode $P_{I2}$ (DQ).

In the example in FIG. 10, the upper surface of the chip $C_P$ includes the upper surfaces of the plurality of bonding electrodes $P_{I2}$, the upper surface of the insulating layer 107, and the upper surface of the insulating layer 108. The area of the insulating layer 107 on the upper surface of the chip $C_P$ is smaller than the area of the insulating layer 108 on the upper surface of the chip $C_P$.

The insulating layer 107 is provided, for example, in a region near a region in which the upper surfaces of the plurality of bonding electrodes $P_{I2}$ (DQ) are provided, on the upper surface of the chip $C_P$. For example, as illustrated in FIG. 8, the entire periphery of the outer edges of the plurality of bonding electrodes $P_{I2}$ (DQ) on the upper surface of the chip $C_P$ are surrounded by the insulating layer 107.

The insulating layer 108 is provided, for example, in a region in which the upper surfaces of the plurality of bonding electrodes $P_{I2}$ are provided and a region other than a region in which the upper surface of the insulating layer 107 is provided, on the upper surface of the chip $C_P$. The insulating layer 108 is provided in a region farther from the plurality of bonding electrodes $P_{I2}$ (DQ) than the insulating layer 107. On the upper surface of the chip $C_P$, the entire periphery of the outer edges of the plurality of bonding electrodes $P_{I2}$ other than the plurality of bonding electrodes $P_{I2}$ (DQ) are surrounded by the insulating layer 108.

In the example in FIG. 13, among the components of the input/output control circuit I/O, some components I/O0 to I/O7 corresponding to the data signal input/output terminals DQ0 to DQ7 are arranged at predetermined intervals in the X direction. Each of the components I/O0 to I/O7 includes an input circuit such as a comparator and an output circuit such as an OCD circuit. The plurality of bonding electrodes $P_{I2}$ (DQ) connected to the above components I/O0 to I/O7 are arranged in the X direction at substantially the same intervals as the components I/O0 to I/O7.

Although not illustrated, in the present embodiment, the wirings between the bonding electrodes $P_{I2}$ (DQ) and the components I/O0 to I/O7 corresponding to the bonding electrodes $P_{I2}$ (DQ) are three-dimensional wirings having a large-scale integrated circuit (LSI) wiring structure. It is desirable to form the wirings so that the wiring lengths of the wirings are as equal to each other as possible to achieve a high-speed signal operation of I/O0 to I/O7.

The wiring length between the bonding electrodes $P_{I2}$ (DQ) and the input/output control circuit I/O may be, for example, the sum of the length, in the X direction, of the wiring extending in the X direction and the length, in the Y direction, of the wiring extending in the Y direction among the plurality of wirings 221, 231, and 241 provided in the current path between the bonding electrodes $P_{I2}$ (DQ) and the input/output control circuit I/O.

For example, as illustrated in FIG. 14, among the plurality of wirings 221 and 231, the wirings that are electrically connected to the bonding pad electrodes $P_X$ ($V_{SS}$) are disposed more densely than other regions (for example, in the region of not overlapping the high-speed I/F circuit when viewed in the Z direction) in the region near the high-speed I/F circuit (for example, in the region of overlapping the high-speed I/F circuit when viewed in the Z direction). Similarly, among the plurality of wirings 221 and 231, the wirings that are electrically connected to the bonding pad electrodes $P_X$ ($V_{CCQ}$) are disposed more densely than other regions (for example, in the region of not overlapping the high-speed I/F circuit when viewed in the Z direction) in the region near the high-speed I/F circuit (for example, in the region of overlapping the high-speed I/F circuit when viewed in the Z direction).

For example, in the example in FIG. 14, the plurality of wirings 221 are arranged at a pitch $P_{Y1}$ in the Y direction in the region near the high-speed I/F circuit. On the other hand, in another region, the plurality of wirings 221 are arranged at a pitch $P_{Y2}$ in the Y direction. The pitch $P_{Y1}$ is smaller than the pitch $P_{Y2}$. In the region near the high-speed I/F circuit, the plurality of wirings 231 are arranged at a pitch $P_{X1}$ in the X direction. On the other hand, in another region, the plurality of wirings 231 are arranged at a pitch $P_{X2}$ in the X direction. The pitch $P_{X1}$ is smaller than the pitch $P_{X2}$.

For convenience of description, FIG. 14 does not illustrate the wirings 241. The wirings 241 may be configured in a similar manner to the wirings 221 and 231. That is, among the plurality of wirings 241, the wirings that are electrically connected to the bonding pad electrode $P_X$ ($V_{SS}$) may be arranged more densely than other regions in the region near the high-speed I/F circuit. Similarly, among the plurality of wirings 241, the wirings that are electrically connected to the bonding pad electrode $P_X$ ($V_{CCQ}$) may be arranged more densely than other regions in the region near the high-speed I/F circuit.

Manufacturing Method

Figure 15:
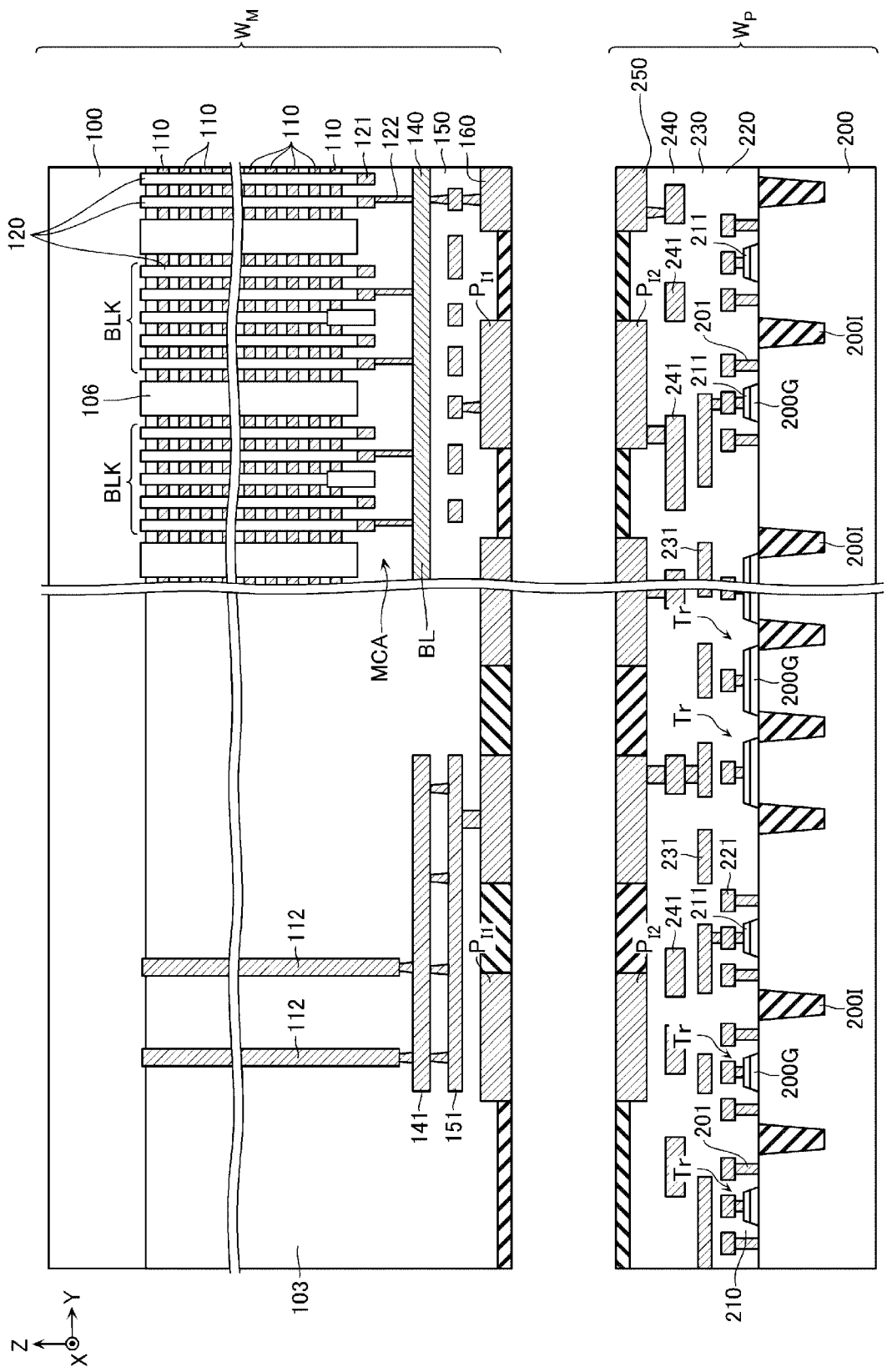
FIG. 15 is a cross-sectional diagram to schematically illustrate a portion of a method of manufacturing the semiconductor storage device.
Figure 16:
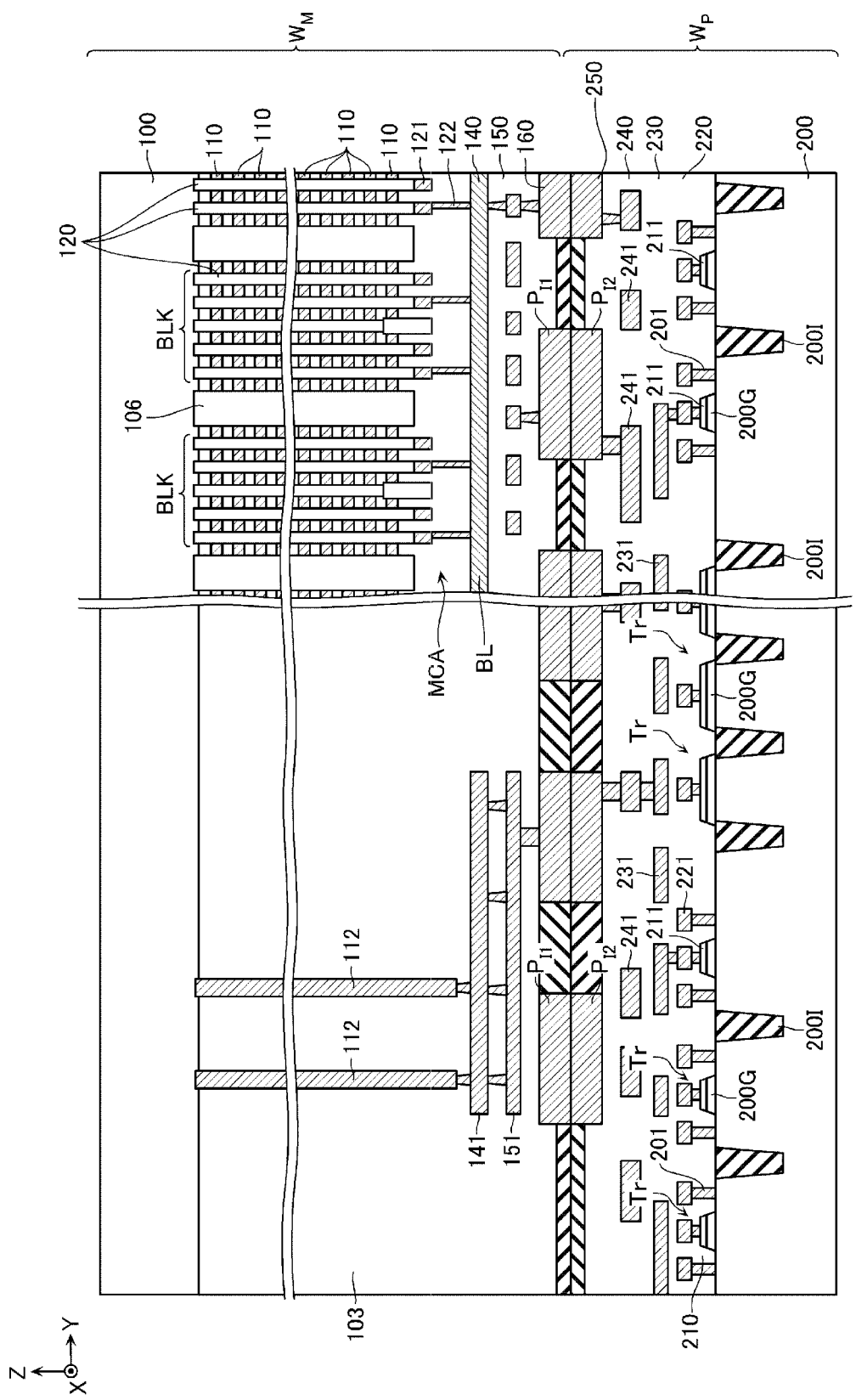
FIG. 16 is a cross-sectional diagram to schematically illustrate another portion of the method of manufacturing the semiconductor storage device.

Next, a manufacturing method of the semiconductor storage device according to the first embodiment will be described with reference to FIGS. 15 and 16. FIGS. 15 and 16 are cross-sectional diagrams to schematically illustrate a portion of the manufacturing method. FIG. 15 illustrates a state where a wafer $W_M$ constituting the chip $C_M$ and a wafer $W_P$ constituting the chip $C_P$ are bonded to each other. FIG. 16 illustrates a state after the wafer $W_M$ and the wafer $W_P$ are bonded to each other.

In the manufacturing method, the wafer $W_M$ constituting the chip $C_M$ and the wafer $W_P$ constituting the chip $C_P$ are respectively formed. Then, as illustrated in FIGS. 15 and 16, the wafer $W_M$ and the wafer $W_P$ are bonded to each other. Then, bonding pad electrodes $P_X$ and the like are formed, and the wafer $W_M$ and the wafer $W_P$ are cut by dicing. In this manner, a memory die MD is formed.

First Comparative Example

Figure 17:
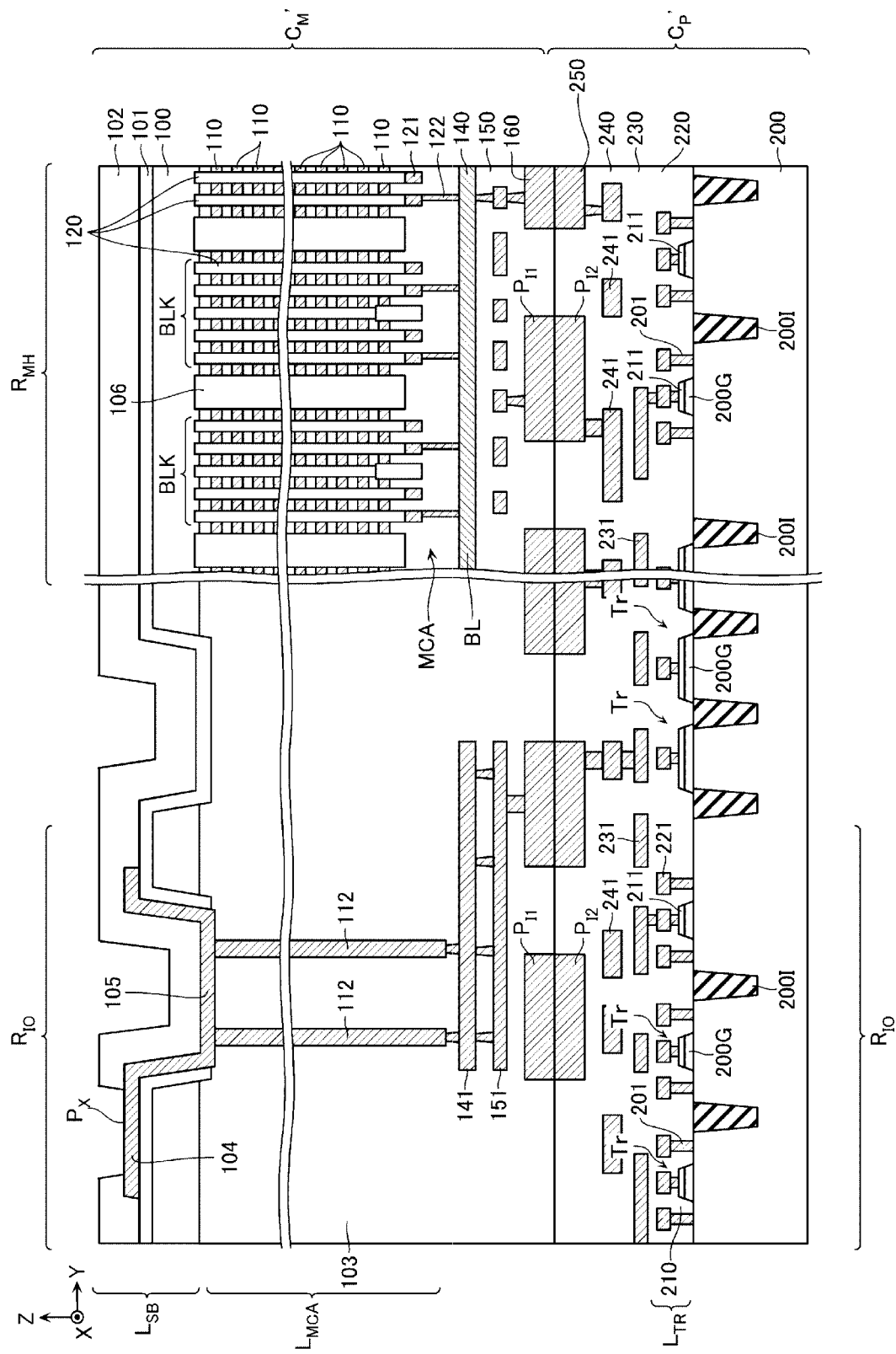
FIG. 17 illustrates a cross-sectional view of a semiconductor storage device according to a first comparative example.

FIG. 17 illustrates a cross-sectional view of a semiconductor storage device according to a first comparative example. The semiconductor storage device according to the first comparative example includes chips $C_M'$ and $C_P'$ instead of the chips $C_M$ and $C_P$. Differing from the chips $C_M$ and $C_P$, the chips $C_M'$ and $C_P'$ do not include the insulating layers 107 and 108.

Second Comparative Example

Figure 18:
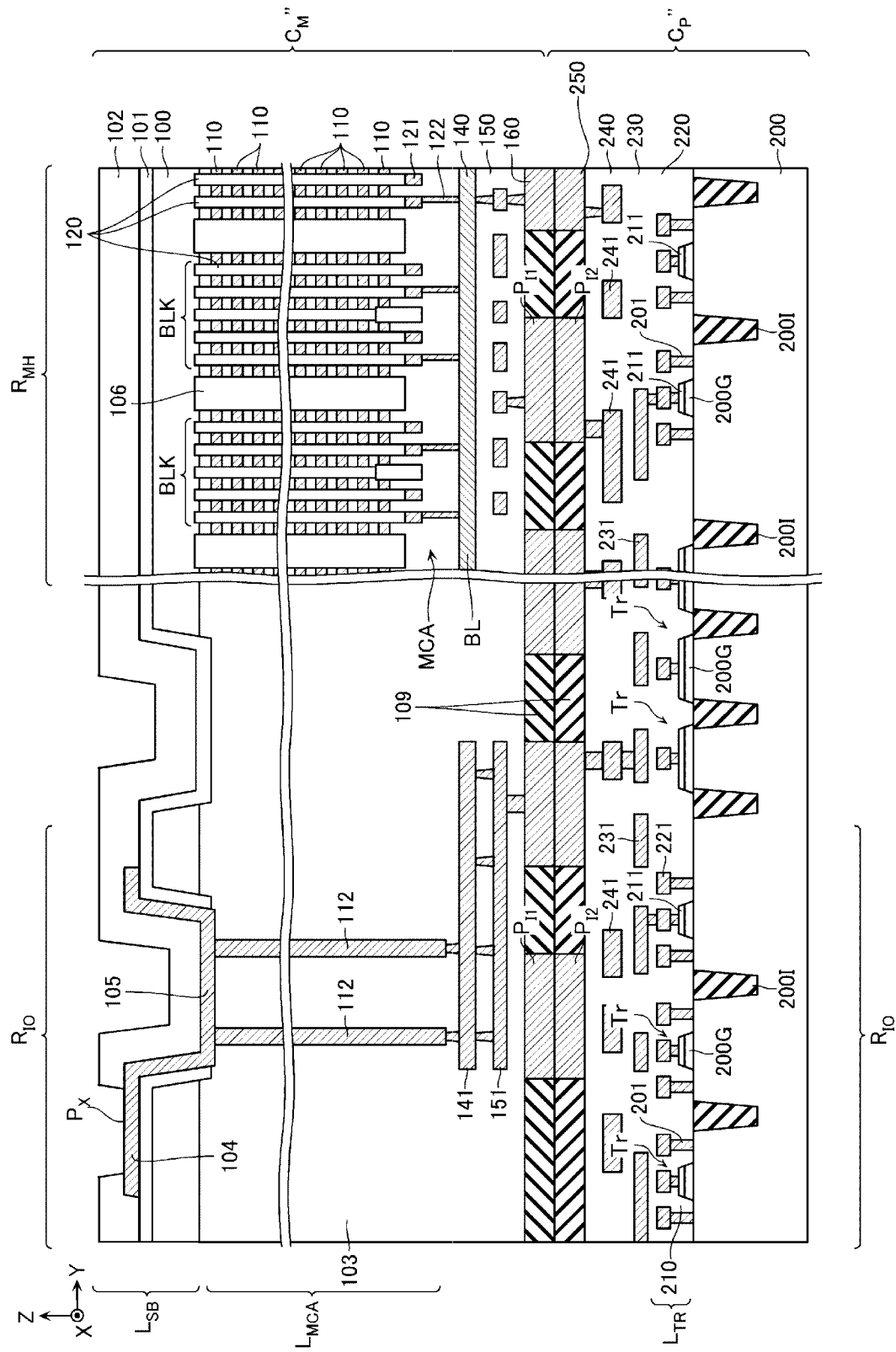
FIG. 18 illustrates a cross-sectional view of a semiconductor storage device according to a second comparative example.

FIG. 18 illustrates a cross-sectional view of a semiconductor storage device according to a second comparative example. The semiconductor storage device according to the second comparative example includes chips $C_M''$ and $C_P''$ instead of the chips $C_M$ and $C_P$. Differing from the chips $C_M$ and $C_P$, the chips $C_M''$ and $C_P''$ do not include the insulating layers 107 and 108. The insulating layer 109 is provided in a region other than a region in which the bonding electrode $P_{f1}$ on the lower surface of the chip $C_M''$ is provided, and in a region other than a region in which the bonding electrode $P_{f2}$ on the upper surface of the chip $C_P''$ is provided. The insulating layer 109 may be, for example, a low dielectric constant insulating layer.

Effects

There is a demand for increasing the speed of an operation of a semiconductor storage device. Here, the input/output control circuit I/O is one of the circuits operating at the highest speed in the semiconductor storage device.

In the semiconductor storage device according to the first comparative example, a plurality of bonding electrodes $P_{f1}$ (DQ) and $P_{f2}$ (DQ) may be arranged close to each other. In such a case, the operation speed may be lowered due to the influence of the parasitic capacitance between these plurality of bonding electrodes $P_{f1}$ (DQ) and $P_{f2}$ (DQ).

In the semiconductor storage device according to the second comparative example, the insulating layer 109 including a low dielectric constant insulating layer is provided in the region other than the region in which the bonding electrode $P_{f1}$ on the lower surface of the chip $C_M''$ is provided, and in the region other than the region in which the bonding electrode $P_{f2}$ on the upper surface of the chip $C_P''$ is provided. According to such a configuration, it is possible to reduce the parasitic capacitance between the bonding electrodes $P_{f1}$ (DQ) and $P_{f2}$ (DQ) and prevent a decrease in the operation speed as described above. However, the low dielectric constant insulating layer generally has low mechanical strength. In such a case, for example, the insulating layer 109 may be damaged in the processes corresponding to FIGS. 15 and 16.

To address such issues, in the semiconductor storage device according to the first embodiment, the insulating layer 107 is provided in the region near the region in which the plurality of bonding electrodes $P_{f1}$ (DQ) are provided on the lower surface of the chip $C_M$. The insulating layer 108 is provided in the region other than the region where the plurality of bonding electrodes $P_{f1}$ are provided and the region where the insulating layer 107 is provided, on the lower surface of the chip $C_M$.

Further, in the semiconductor storage device according to the first embodiment, the insulating layer 107 is provided in the region near the region in which the plurality of bonding electrodes $P_{f2}$ (DQ) are provided on the upper surface of the chip $C_P$. The insulating layer 108 is provided in the region other than the region where the plurality of bonding electrodes $P_{f2}$ are provided and the region where the insulating layer 107 is provided, on the upper surface of the chip $C_P$.

According to such a configuration, it is possible to reduce the parasitic capacitance between the plurality of bonding electrodes $P_{f1}$ (DQ) and $P_{f2}$ (DQ) while enhancing the mechanical strength of the lower surface of the chip $C_M$ and the upper surface of the chip $C_P$, and thus to increase the speed of the operation of the semiconductor storage device.

Further, in the semiconductor storage device according to the first embodiment, for example, as described with reference to FIG. 12, all the wiring lengths between the bonding pad electrodes $P_X$ (DQ) and the bonding electrode $P_{f1}$ (DQ) are equal to each other. Similarly, all the wiring lengths between the bonding electrode $P_{f2}$ (DQ) and the input/output control circuit I/O are equal to each other.

According to such a configuration, it is possible to suitably operate the input/output control circuit I/O by aligning the characteristics such as signal delays occurring in the data signal input/output terminals DQ0 to DQ7 and the toggle signal input/output terminals DQ0 and /DQS, within a predetermined range.

In addition, in the semiconductor storage device according to the first embodiment, for example, as described with reference to FIG. 14, in the chip $C_P$, the plurality of wirings 221, 231, and 241 that are electrically connected to the bonding pad electrode $P_X$ ($V_{SS}$) and $P_X$ ($V_{CCQ}$) are arranged more densely than other regions, in the upper layer of the high-speed I/F circuit.

According to such a configuration, it is possible to suitably operate the input/output control circuit I/O while enhancing the degree of freedom in design in the wiring layers 140, 150, 220, 230, and 240.

Second Embodiment

Figure 19:
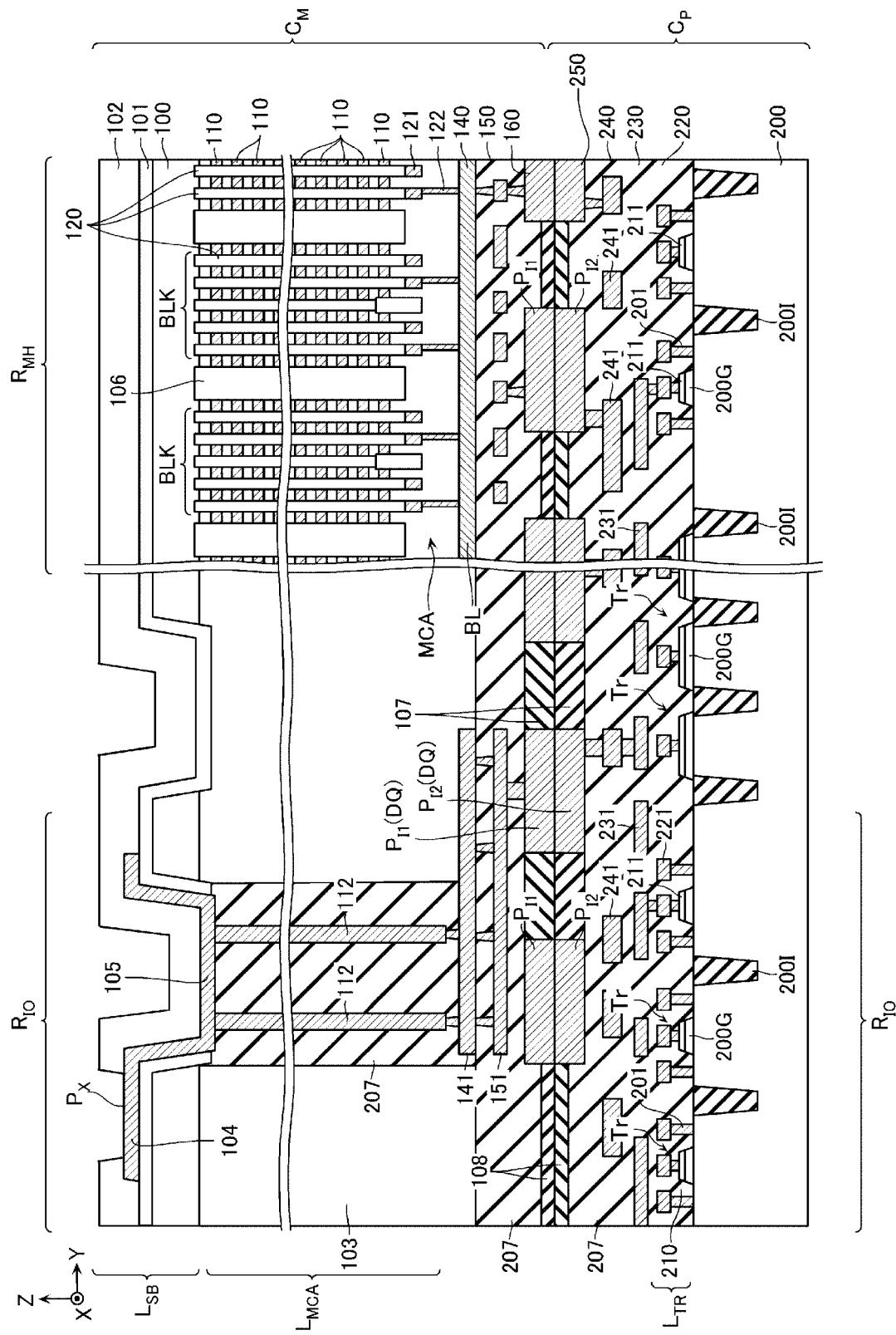
FIG. 19 illustrates a cross-sectional view of an example of a semiconductor storage device according to a second embodiment.

Next, a semiconductor storage device according to a second embodiment will be described with reference to FIG. 19. FIG. 19 illustrates a cross-sectional view of an example of the semiconductor storage device according to the second embodiment.

The semiconductor storage device according to the second embodiment is basically configured in a similar manner to the semiconductor storage device according to the first embodiment. The semiconductor storage device according to the second embodiment also includes an insulating layer 207. The insulating layer 207 is basically configured in a similar manner to the insulating layer 107.

The insulating layer 207 in the chip $C_M$ is provided from the lower surface of the semiconductor layer 100 to the vicinity of the lower surface of the chip $C_M$. The insulating layer 207 covers not only the side surfaces of the bonding electrodes $P_{f1}$ (DQ) in the X direction and the Y direction, but also the side surfaces of the plurality of wirings 141 and 151, in the X direction and the Y direction, which are connected to the bonding electrodes $P_{f1}$ (DQ), and an outer peripheral surface of the contacts 112 connected to the plurality of wirings 141 and 151. In the example illustrated in FIG. 19, a portion of the insulating layer 103 provided in the input/output circuit region $R_{IO}$ is removed, and the insulating layer 207 is provided in this region. Further, the insulating layer 207 is provided between the wirings in all regions below the lower surface of the wiring 141.

The insulating layer 207 in the chip $C_P$ is provided from the upper surface of the semiconductor substrate 200 to the vicinity of the upper surface of the chip $C_P$. The insulating layer 207 covers not only the side surfaces of the bonding electrodes $P_{I2}$ (DQ) in the X direction and the Y direction, but also the side surfaces of the plurality of wirings 221, 231, 241, in the X direction and the Y direction, which are connected to the bonding electrodes $P_{I2}$ (DQ), and an outer peripheral surface of the contacts 201 connected to the plurality of wirings 221, 231, 241. In the example illustrated in FIG. 19, the insulating layer 207 is provided between the wirings in all regions from the upper surface of the semiconductor substrate 200 to the upper surface of the chip $C_P$.

According to such a configuration, it is possible to reduce not only the parasitic capacitance between the plurality of bonding electrodes $P_{I1}$ (DQ) and $P_{I2}$ (DQ), but also parasitic capacitance in other wirings connected to the plurality of bonding electrodes $P_{I1}$ (DQ) and $P_{I2}$ (DQ), and thus, to further increase the speed of the operation of the semiconductor storage device.

Figure 20:
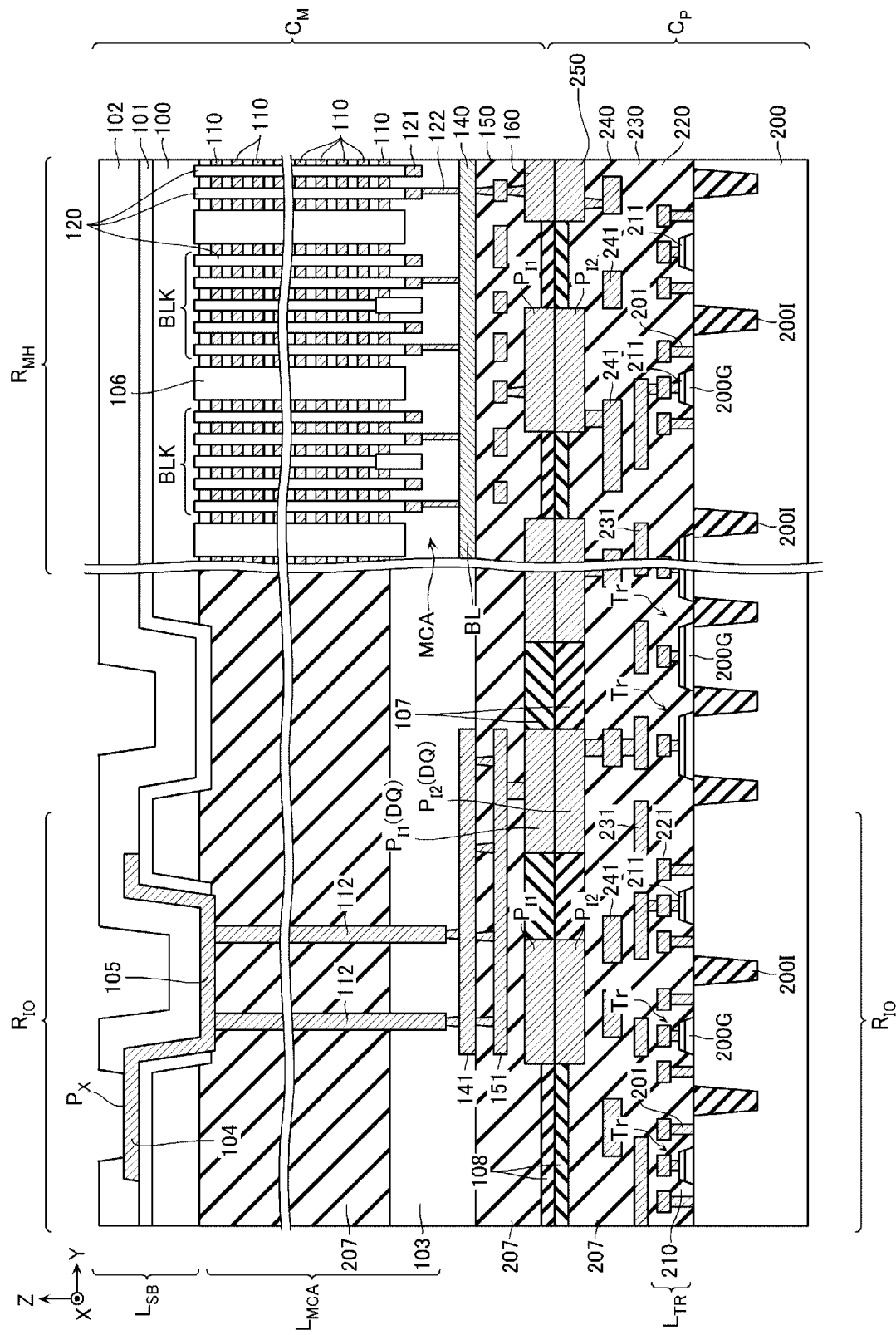
FIG. 20 illustrates a cross-sectional view of another example of the semiconductor storage device according to the second embodiment.

The configuration as illustrated in FIG. 19 is merely an example, and the specific configuration may be adjusted as appropriate. FIG. 20 illustrates a cross-sectional view of another example of the semiconductor storage device according to the second embodiment.

The configuration illustrated in FIG. 20 is basically similar to the configuration illustrated in FIG. 19. However, in the configuration illustrated in FIG. 20, the insulating layer 207 is provided between the wirings in the entirety of the peripheral region $R_P$ (FIG. 7) from the lower surface of the semiconductor layer 100 to a position of a height corresponding to the lower surface of the conductive layer 110 located at the lowermost position. Further, the insulating layer 103 is provided between the wirings in all regions from the position of the height corresponding to the lower surface of the conductive layer 110 located at the lowermost position, to the lower surface of the wiring 141.

Third Embodiment

Figure 21:
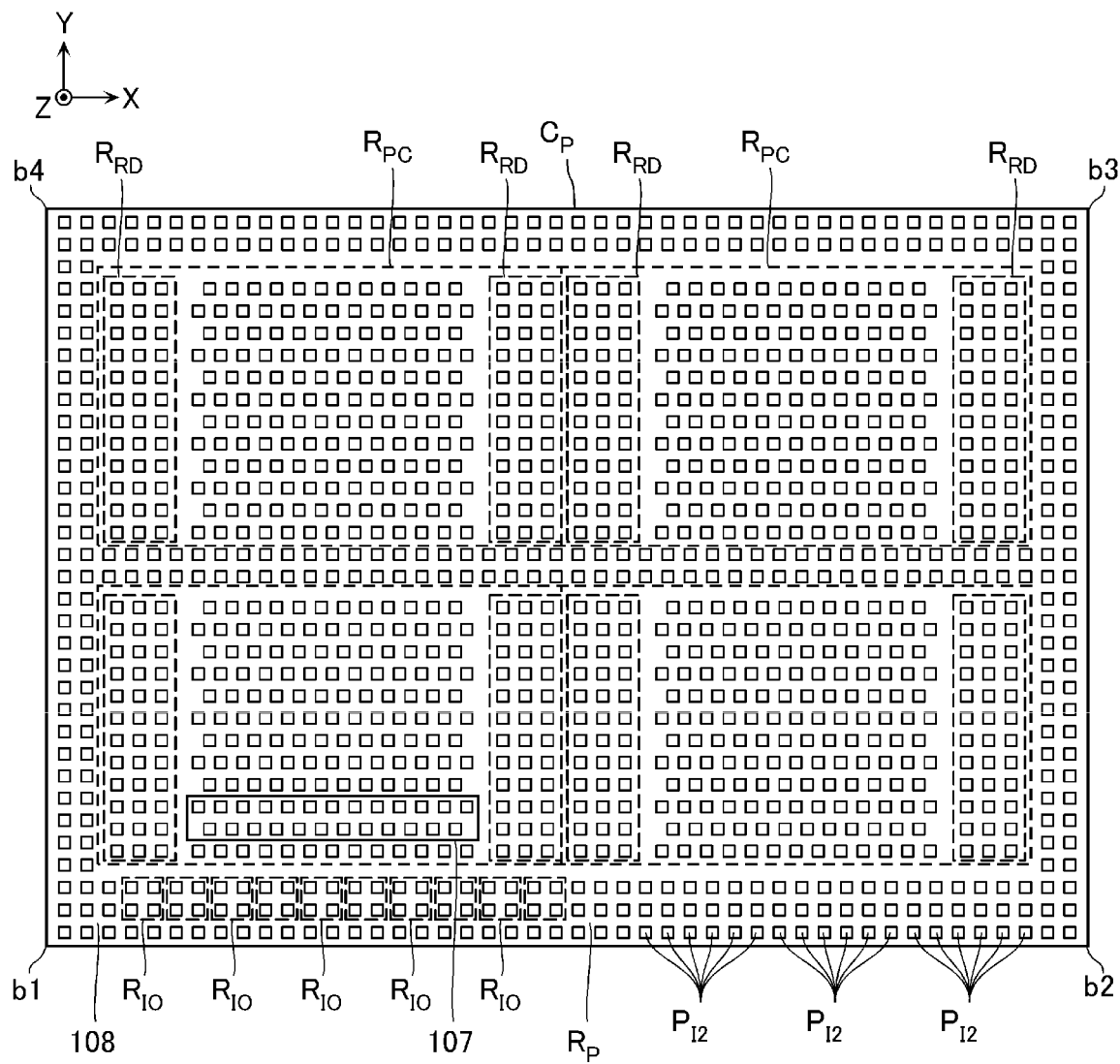
FIG. 21 illustrates a plan view of an example of a semiconductor storage device according to a third embodiment.
Figure 22:
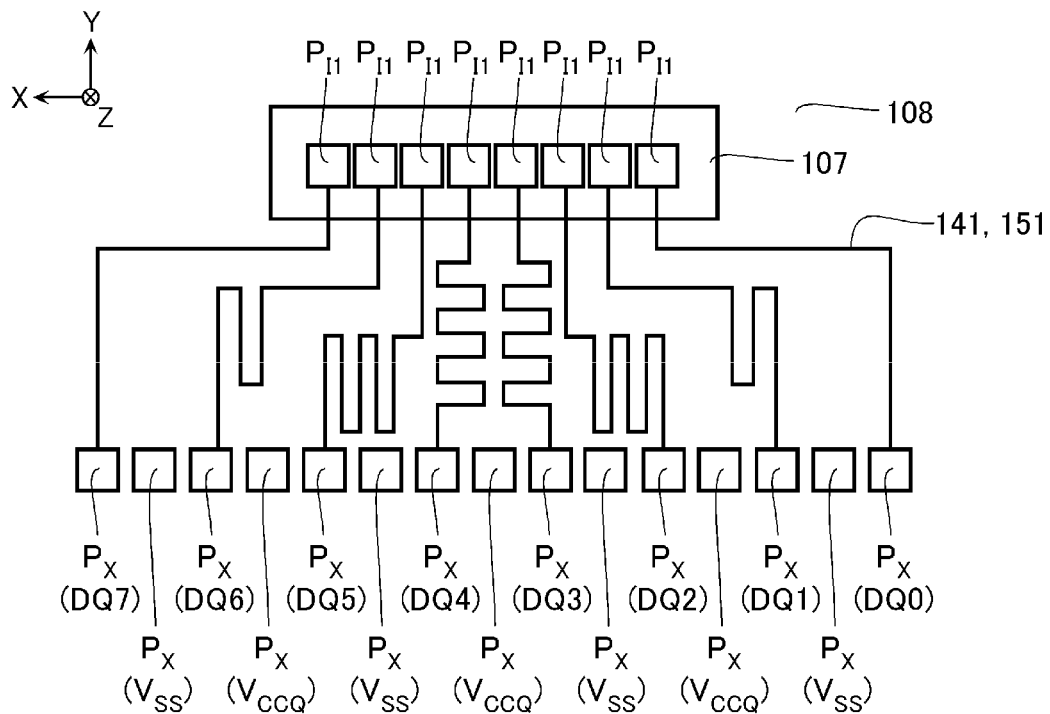
FIG. 22 illustrates a bottom view of a part of the semiconductor storage device according to the third embodiment.

Next, a semiconductor storage device according to a third embodiment will be described with reference to FIGS. 21 and 22. FIG. 21 illustrates a plan view of the semiconductor storage device according to the third embodiment. FIG. 22 illustrates a bottom view of a part of the semiconductor storage device according to the third embodiment.

The semiconductor storage device according to the third embodiment is basically configured in a similar manner to the semiconductor storage device according to the first embodiment.

It is noted that, as illustrated in FIG. 8, in the semiconductor storage device according to the first embodiment, the insulating layer 107 is provided at a position overlapping the input/output circuit region $R_{IO}$ when viewed in the Z direction.

On the other hand, as illustrated in FIG. 21, in the semiconductor storage device according to the third embodiment, the insulating layer 107 is provided at a position overlapping the circuit region $R_{PC}$ when viewed in the Z direction.

FIG. 22 illustrates wirings provided on the current path between the bonding pad electrode $P_X$ (DQ) and the bonding electrode $P_{I1}$ (DQ) among the plurality of wirings 141 and 151. In the present embodiment, the wirings between the bonding pad electrodes $P_X$ (DQ) and the bonding electrodes $P_{I1}$ (DQ) are three-dimensional wirings having a large-scale integrated circuit (LSI) wiring structure. It is desirable to form the wirings so that the wiring lengths of the wirings are as equal to each other as possible to achieve a high-speed signal operation.

Fourth Embodiment

Figure 23:
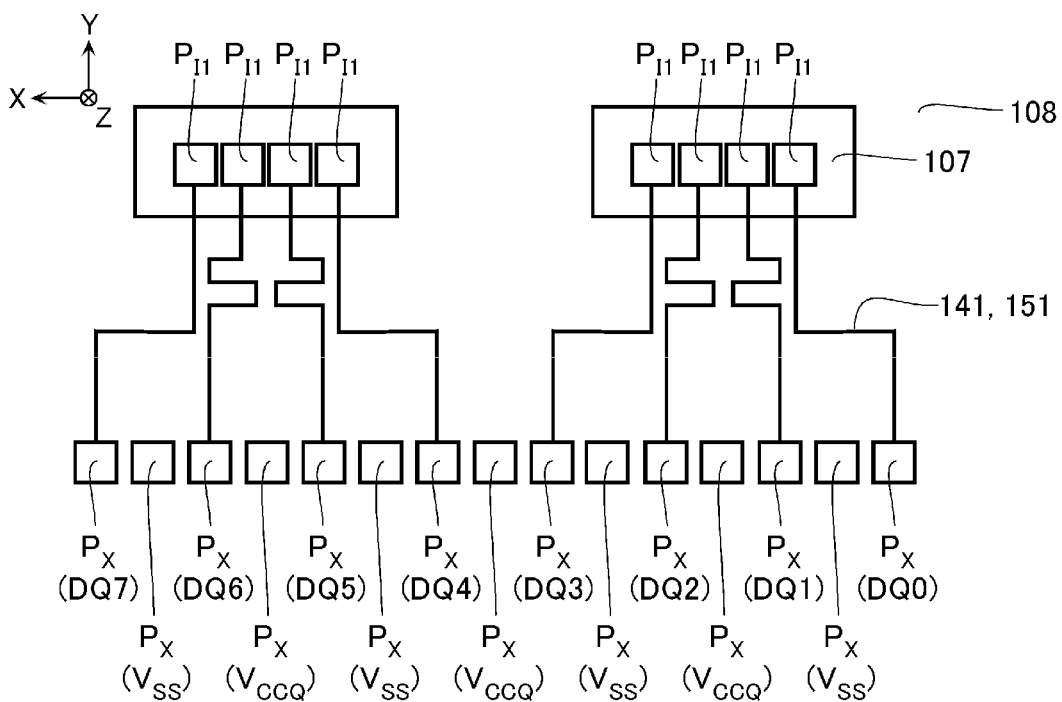
FIG. 23 illustrates a bottom view of a part of a semiconductor storage device according to a fourth embodiment.
Figure 24:
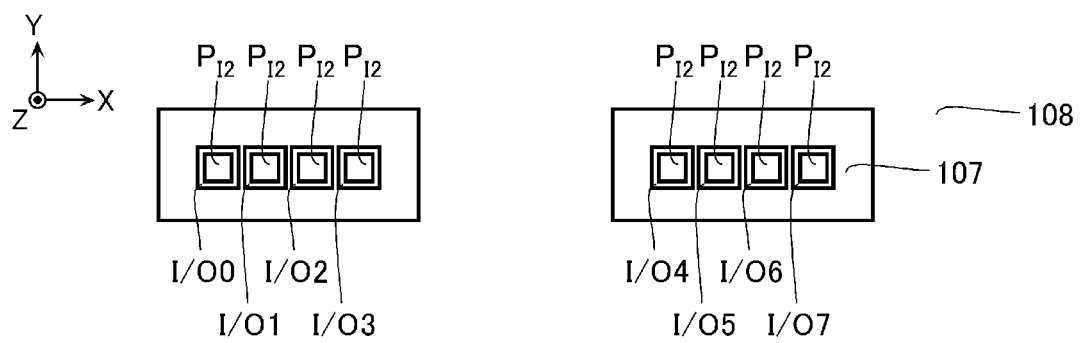
FIG. 24 illustrates a plan view of a part of the semiconductor storage device according to the fourth embodiment.
Figure 25:
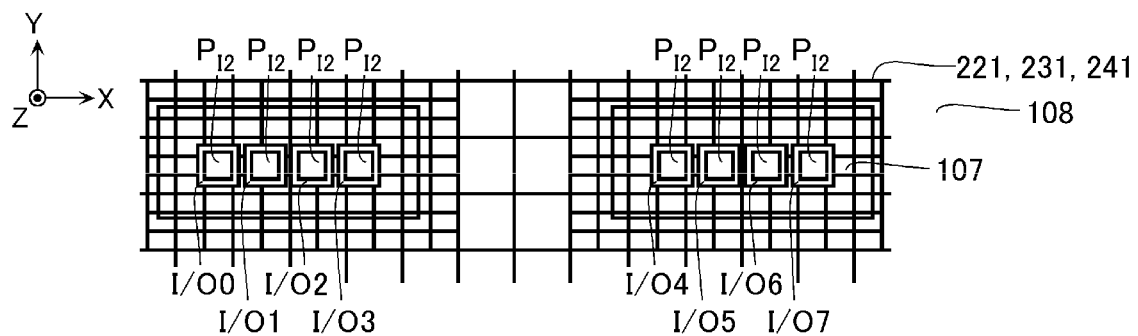
FIG. 25 illustrates a plan view of another part of the semiconductor storage device according to the fourth embodiment.

Next, a semiconductor storage device according to a fourth embodiment will be described with reference to FIGS. 23 to 25. FIG. 23 illustrates a bottom view of a part of the semiconductor storage device according to the fourth embodiment. FIGS. 24 and 25 illustrate plan views of parts of the semiconductor storage device according to the fourth embodiment.

The semiconductor storage device according to the fourth embodiment is basically configured in a similar manner to the semiconductor storage device according to the third embodiment.

As described with reference to FIG. 22, in the semiconductor storage device according to the third embodiment, all the bonding electrodes $P_{I1}$ (DQ) arranged on the lower surface of the chip $C_M$ are arranged together in one place. Further, one insulating layer 107 continuously formed is provided on the lower surface of the chip $C_M$, and the outer peripheral surfaces of all the bonding electrodes $P_{I1}$ (DQ) are surrounded by the insulating layer 107.

On the other hand, as illustrated in FIG. 23, in the semiconductor storage device according to the fourth embodiment, some of all the bonding electrodes $P_{I1}$ (DQ) arranged on the lower surface of the chip $C_M$ and the others are arranged in different regions. Further, two insulating layers 107 that are provided corresponding to the above regions and are spaced from each other are provided on the lower surface of the chip $C_M$. Further, the outer peripheral surfaces of the plurality of bonding electrodes $P_{I1}$ (DQ) provided in one region are surrounded by the one insulating layer 107. Further, the outer peripheral surfaces of the plurality of bonding electrodes $P_{I1}$ (DQ) provided in the other region are surrounded by the other insulating layer 107.

As illustrated in FIGS. 24 and 25, in the semiconductor storage device according to the fourth embodiment, some of all the bonding electrodes $P_{I2}$ (DQ) arranged on the upper surface of the chip $C_P$ and the others are arranged in different regions. Further, two insulating layers 107 provided corresponding to the above regions are provided on the upper surface of the chip $C_P$. Further, the outer peripheral surfaces of the plurality of bonding electrodes $P_{I2}$ (DQ) provided in one region are surrounded by the one insulating layer 107. Further, the outer peripheral surfaces of the plurality of bonding electrodes $P_{I2}$ (DQ) provided in the other region are surrounded by the other insulating layer 107.

As illustrated in FIG. 23, also in the semiconductor storage device according to the fourth embodiment, all the wiring lengths between the bonding pad electrodes $P_X$ (DQ) and the bonding electrodes $P_{I1}$ (DQ) are equal to each other.

Further, although not illustrated, in the semiconductor storage device according to the fourth embodiment, all the wiring lengths between the bonding electrodes $P_{I2}$ (DQ) and the components I/O0 to I/O7 in the input/output control circuit I/O are equal to each other. Further, as illustrated in FIG. 25, among the plurality of wirings 221, 231, and 241, the wirings that are electrically connected to the bonding pad electrodes $P_X$ ($V_{SS}$) are arranged more densely than other regions in the region near the insulating layer 107. Further, among the plurality of wirings 221, 231, and 241, the wirings that are electrically connected to the bonding pad electrodes $P_X$ ($V_{CCQ}$) are arranged more densely than other regions in the region near the insulating layer 107.

Here, in the manufacturing process of the semiconductor storage device, chemical mechanical polishing (CMP) may be performed when at least one of the bonding electrodes $P_{f1}$ and the insulating layer 107 is formed. Here, when the insulating layer 107 is solidified and disposed in one place, dishing occurs when the CMP is performed. Thus, it may not be possible to bond the chip $C_M$ and the chip $C_P$ properly.

To address such an issue, in the fourth embodiment, the insulating layer 107 is dispersedly arranged on the lower surface of the chip $C_M$. Thus, it is possible to reduce the influence of the above-described dishing.

Semiconductor Storage Device According to Other Embodiments

Hitherto, the semiconductor storage device according to the first to fourth embodiments has been described. It is noted that such configurations are merely examples, and the specific configuration may be adjusted as appropriate.

For example, in the semiconductor storage device according to the first embodiment, the insulating layer 107 having a low dielectric constant is provided near the front surfaces of the chips $C_M$ and $C_P$. On the other hand, in the semiconductor storage device illustrated in FIG. 19, the insulating layers 107 and 207 having a low dielectric constant are provided from the lower surface of the semiconductor layer 100 of the chip $C_M$ to the vicinity of the lower surface of the chip $C_M$. Further, the insulating layers 107 and 207 having a low dielectric constant are provided from the upper surface of the semiconductor substrate 200 of the chip $C_P$ to the upper surface of the chip $C_P$. It is possible to adjust the region in which the insulating layers 107 and 207 or the low dielectric constant insulating layer corresponding to the insulating layers 107 and 207 are provided, in the Z direction, as appropriate.

For example, in the semiconductor storage device according to the first embodiment, all the bonding electrodes $P_{f1}$ (DQ) arranged on the lower surface of the chip $C_M$ are arranged together in one place, and the outer peripheral surfaces of the plurality of bonding electrodes $P_{f1}$ (DQ) are surrounded by the one insulating layer 107 that is continuously formed. On the other hand, in the semiconductor storage device according to the fourth embodiment, some of all the bonding electrodes $P_{f1}$ (DQ) arranged on the lower surface of the chip $C_M$ and the others are arranged in different regions, and the outer peripheral surfaces of the plurality of bonding electrodes $P_{f1}$ (DQ) provided in the one region and the outer peripheral surfaces of the plurality of bonding electrodes $P_{f1}$ (DQ) provided in the other region are surrounded by the two insulating layers 107 spaced from each other. It is possible to adjust the number of regions in which the plurality of bonding electrodes $P_{f1}$ (DQ) are arranged, as appropriate. Further, it is possible to adjust the number of insulating layers 107 and 207 provided on the lower surface of the chip $C_M$ and the upper surface of the chip $C_P$, as appropriate.

Further, for example, in the semiconductor storage device according to the first to fourth embodiments, an example in which the bonding pad electrodes $P_X$ are provided on the chip $C_M$ has been described. Alternatively, the bonding pad electrodes $P_X$ may be provided on the chip $C_P$ instead of the chip $C_M$.

Figure 26:
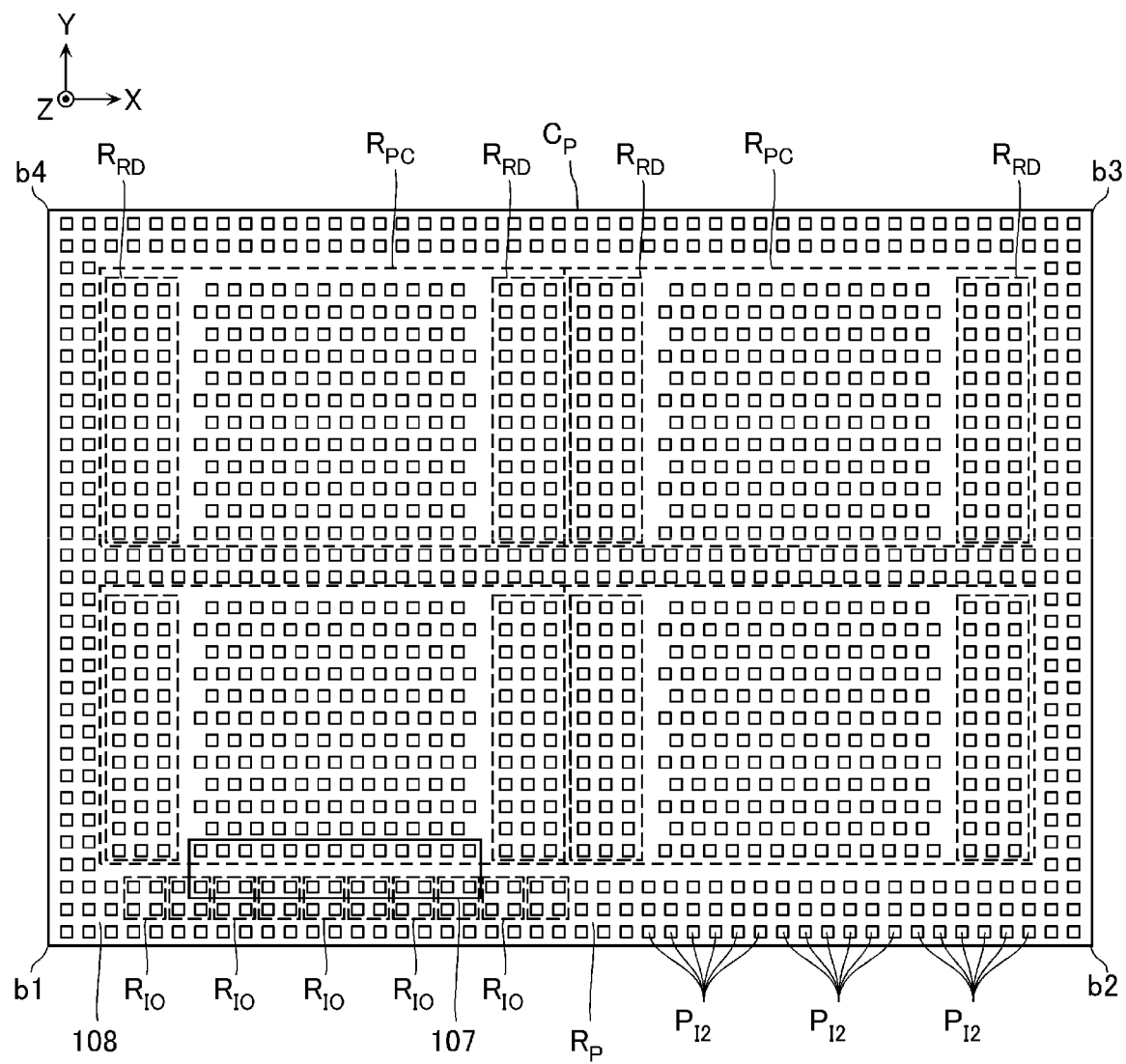
FIG. 26 illustrates a plan view of an example of a semiconductor storage device according to another embodiment.

For example, as illustrated in FIG. 8, in the semiconductor storage device according to the first embodiment, the insulating layer 107 is provided at a position overlapping the input/output circuit region $R_{IO}$ when viewed in the Z direction. Further, for example, as illustrated in FIG. 21, in the semiconductor storage device according to the third embodiment, the insulating layer 107 is provided at a position overlapping the circuit region $R_{PC}$ when viewed in the Z direction. It is possible to adjust the region in which the insulating layer 107 is provided as appropriate. For example, in the example in FIG. 26, the portion of the insulating layer 107 is provided at the position overlapping the input/output circuit region $R_{IO}$ when viewed in the Z direction. Further, the portion of the insulating layer 107 is provided at the position overlapping the circuit region $R_{PC}$ when viewed in the Z direction.

Further, for example, in the semiconductor storage device according to the first to fourth embodiments, all the wiring lengths between the bonding pad electrodes $P_X$ (DQ) and the bonding electrodes $P_{f1}$ (DQ) are equal to each other. Alternatively, the wiring lengths between the bonding pad electrodes $P_X$ (DQ) and the bonding electrodes $P_{f1}$ (DQ) may be different from each other. It is desirable that the wiring lengths between the bonding pad electrodes $P_X$ (DQ) and the bonding electrodes $P_{f1}$ (DQ) be as equal as possible.

Similarly, in the semiconductor storage device according to the first to fourth embodiments, all the wiring lengths between the bonding electrodes $P_{f2}$ (DQ) and the input/output control circuit I/O are equal to each other. However, the wiring lengths between the bonding electrodes $P_{f2}$ (DQ) and the input/output control circuit I/O may be different from each other. It is desirable that the wiring lengths between the bonding electrodes $P_{f2}$ (DQ) and the input/output control circuit I/O be as equal as possible.

Design Method of Semiconductor Storage Device

In the above description, the plurality of bonding pad electrodes $P_X$ (DQ), and the plurality of bonding electrodes $P_{f1}$ (DQ) and $P_{f2}$ (DQ) connected to the plurality of bonding pad electrodes $P_X$ (DQ) are arranged in the X direction at different intervals. Further, all the wiring lengths between the bonding pad electrodes $P_X$ (DQ) and the bonding electrodes $P_{f1}$ (DQ) and $P_{f2}$ (DQ) are equal to each other. Further, all the wiring lengths between the bonding electrodes $P_{f1}$ (DQ) and $P_{f2}$ (DQ) and the input/output control circuit I/O are equal to each other.

In the above description, among the plurality of wirings 221, 231, and 241, the wirings that are electrically connected to the bonding pad electrodes $P_X$ ($V_{SS}$) and $P_X$ ($V_{CCQ}$) are arranged more densely than other regions, in the region near the insulating layer 107.

In the design of the semiconductor storage device, a wiring pattern may be designed under a condition of satisfying such conditions.

Further, in the design of the semiconductor storage device, for example, all the wiring lengths between the bonding pad electrodes $P_X$ (DQ) and the bonding electrodes $P_{f1}$ (DQ) may be set not to be equal to each other. Further, all the wiring lengths between the bonding electrodes $P_{f2}$ (DQ) and the input/output control circuit I/O may be set not to be equal to each other. In such a case, for example, the wiring pattern may be designed under such a condition that all the wiring lengths between the bonding pad electrodes $P_X$ (DQ) and the components I/O0 to I/O7 in the input/output control circuit I/O are equal to each other.

The wiring patterns as illustrated in FIGS. 12 to 14 and 22 to 25 are schematically illustrated for description, and the specific wiring patterns may be adjusted as appropriate.

OTHERS

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a first chip including a semiconductor substrate and a plurality of transistors, the first chip having a plurality of first bonding electrodes on a first surface; and
   a second chip including a memory cell array, the second chip having a plurality of second bonding electrodes on a second surface, the first surface being bonded to the second surface and the first bonding electrodes being electrically connected to the second bonding electrodes, wherein
   one of the first and second chips has a first bonding pad electrode connectable to a bonding wire for data input/output,
   a first one of the first bonding electrodes is electrically connected to the first bonding pad electrode, and
   the first chip has, on the first surface:
      a first insulating layer provided around outer side surfaces of the first one of the first bonding electrodes; and
      a second insulating layer that is farther from the first one of the first bonding electrodes than the first insulating layer, provided around outer side surfaces of the first insulating layer, and formed of a material different from that of the first insulating layer.

2. The semiconductor storage device according to claim 1, wherein a relative dielectric constant of the first insulating layer is smaller than a relative dielectric constant of the second insulating layer.

3. The semiconductor storage device according to claim 1, wherein
   a relative dielectric constant of the first insulating layer is equal to or smaller than 4.0, and
   a relative dielectric constant of the second insulating layer is greater than 4.0.

4. The semiconductor storage device according to claim 1, wherein
   the first insulating layer contains silicon (Si), oxygen (O), and at least one of carbon (C) and fluorine (F), and
   the second insulating layer contains silicon (Si) and at least one of oxygen (O) and nitrogen (N).

5. The semiconductor storage device according to claim 1, wherein an area of the first insulating layer on the first surface is smaller than an area of the second insulating layer on the first surface.

6. The semiconductor storage device according to claim 1, wherein the second chip includes the first bonding pad electrode on a third surface opposite to the second surface.

7. The semiconductor storage device according to claim 6, wherein the second chip further includes:
   a contact extending from the first bonding pad electrode toward the second surface and electrically connected to the first one of the first bonding electrodes; and
   a third insulating layer surrounding the contact, the third insulating layer being formed of a same material as the first insulating layer.

8. The semiconductor storage device according to claim 6, wherein
   a first one of the second bonding electrodes is electrically connected between the first one of the first bonding electrodes and the first bonding pad electrode, and
   the second chip comprises, on the second surface:
      a third insulating layer provided around outer side surfaces of the first one of the second bonding electrodes; and
      a fourth insulating layer that is farther from the first one of the second bonding electrodes than the third insulating layer, provided around outer side surfaces of the third insulating layer, and formed of a material different from that of the third insulating layer.

9. The semiconductor storage device according to claim 8, wherein a relative dielectric constant of the third insulating layer is smaller than a relative dielectric constant of the fourth insulating layer.

10. The semiconductor storage device according to claim 1, wherein
    the one of the first and second chips further includes a second bonding pad electrode connectable to a second bonding wire for data input/output,
    a second one of the first bonding electrodes is electrically connected to the second bonding pad electrode, and
    the first insulating layer surrounds the second one of the first bonding electrodes.

11. The semiconductor storage device according to claim 10, further comprising:
    an input/output circuit electrically connected to the first and second bonding pad electrodes,
    wherein a wiring length from the first bonding pad electrode to the input/output circuit is equal to a wiring length from the second bonding pad electrode to the input/output circuit.

12. The semiconductor storage device according to claim 1, wherein
    the one of the first and second chips further includes a third bonding pad electrode connectable to a second bonding wire for power supply,
    the first chip further includes:
       a high-speed I/F circuit electrically connected to the first and third bonding pad electrodes;
       a plurality of first wirings arranged along the first surface below the first insulating layer at a first pitch and below the second insulating layer at a second pitch greater than the first pitch.

13. The semiconductor storage device according to claim 1, wherein the first one of the first bonding electrodes and the first bonding pad electrode overlap with each other in a thickness direction of the semiconductor storage device.

14. The semiconductor storage device according to claim 1, wherein the first one of the first bonding electrodes and the memory cell array overlap with each other in a thickness direction of the semiconductor storage device.

15. A semiconductor storage device comprising:
    a first chip including a semiconductor substrate and a plurality of transistors, the first chip having a plurality of first bonding electrodes on a first surface; and
    a second chip including a memory cell array, the second chip having a plurality of second bonding electrodes on a second surface, the first surface being bonded to the second surface and the first bonding electrodes being electrically connected to the second bonding electrodes, wherein
    one of the first and second chips has a first bonding pad electrode connectable to a bonding wire for data input/output, a first one of the second bonding electrodes is electrically connected to the first bonding pad electrode, and the second chip has, on the second surface:

a first insulating layer provided around outer side surfaces of the first one of the second bonding electrodes; and a second insulating layer that is farther from the first one of the second bonding electrodes than the first insulating layer, provided around outer side surfaces of the first insulating layer, and formed of a material different from that of the first insulating layer.

16. The semiconductor storage device according to claim 15, wherein a relative dielectric constant of the first insulating layer is smaller than a relative dielectric constant of the second insulating layer.

17. The semiconductor storage device according to claim 15, wherein a relative dielectric constant of the first insulating layer is equal to or smaller than 4.0, and a relative dielectric constant of the second insulating layer is greater than 4.0.

18. The semiconductor storage device according to claim 15, wherein the first insulating layer contains silicon (Si), oxygen (O), and at least one of carbon (C) and fluorine (F), and the second insulating layer contains silicon (Si) and at least one of oxygen (O) and nitrogen (N).

19. The semiconductor storage device according to claim 15, wherein an area of the first insulating layer on the second surface is smaller than an area of the second insulating layer on the second surface.

20. The semiconductor storage device according to claim 15, wherein the second chip includes the first bonding pad electrode on a third surface opposite to the second surface.

* * * * *